(12) United States Patent
Park et al.

(10) Patent No.: US 10,622,395 B2
(45) Date of Patent: Apr. 14, 2020

(54) IMAGE SENSING DEVICE

(71) Applicant: SAMSUNG ELECTRONICS CO., LTD.

(72) Inventors: Sang Su Park, Seoul (KR); Jung Hun Kim, Suwon-si (KR); Chang Hwa Kim, Hwaseong-si (KR); Beom Suk Lee, Yongin-si (KR); Gang Zhang, Suwon-si (KR); Man Geun Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/011,672

(22) Filed: Jun. 19, 2018

(65) Prior Publication Data

US 2019/0148423 A1 May 16, 2019

(30) Foreign Application Priority Data

Nov. 13, 2017 (KR) .......................... 10-2017-0150547

(51) Int. Cl.
*H01L 27/146* (2006.01)
*H01L 27/30* (2006.01)

(52) U.S. Cl.
CPC ...... *H01L 27/1463* (2013.01); *H01L 27/1464* (2013.01); *H01L 27/14603* (2013.01); *H01L 27/14621* (2013.01); *H01L 27/14643* (2013.01); *H01L 27/14665* (2013.01); *H01L 27/307* (2013.01); *H01L 27/1462* (2013.01); *H01L 27/14627* (2013.01); *H01L 27/14636* (2013.01)

(58) Field of Classification Search
CPC .......... H01L 27/1463; H01L 27/14603; H01L 27/14621; H01L 27/14643; H01L 27/14665; H01L 27/307

See application file for complete search history.

(56) References Cited

U.S. PATENT DOCUMENTS

| | | | |
|---|---|---|---|
| 9,054,007 B2 * | 6/2015 | Hu | H01L 27/14643 |
| 9,087,872 B2 | 7/2015 | Favennec et al. | |
| 9,385,166 B2 | 7/2016 | Jung et al. | |
| 9,425,231 B2 | 8/2016 | Kim et al. | |
| 9,520,435 B2 | 12/2016 | Ahmed et al. | |
| 9,620,548 B1 | 4/2017 | Wang et al. | |
| 2014/0246707 A1 * | 9/2014 | Koo | H01L 27/14614 257/230 |
| 2015/0372036 A1 | 12/2015 | Suh et al. | |
| 2017/0025461 A1 | 1/2017 | Lee et al. | |
| 2017/0062513 A1 | 3/2017 | Koo et al. | |

(Continued)

*Primary Examiner* — Matthew L Reames
(74) *Attorney, Agent, or Firm* — Volentine, Whitt & Francos, PLLC

(57) ABSTRACT

An image sensing device includes a photoelectric device disposed within a semiconductor substrate, and a separation structure and electrode structures disposed within the semiconductor substrate, and surrounding the photoelectric device. The separation structure includes a first conductive pattern, and a first insulating spacer between the first conductive pattern and the semiconductor substrate. A respective one of the electrode structures includes a second conductive pattern, and a second insulating spacer between the second conductive pattern and the semiconductor substrate. The first conductive pattern and the second conductive pattern are formed of the same conductive material.

18 Claims, 23 Drawing Sheets

(56) References Cited

U.S. PATENT DOCUMENTS

| | | |
|---|---|---|
| 2017/0170217 A1 | 6/2017 | Yanagita et al. |
| 2017/0170239 A1 | 6/2017 | Lee et al. |
| 2018/0190707 A1 | 7/2018 | Lee et al. |
| 2019/0088693 A1* | 3/2019 | Kato .................. H01L 27/1463 |

* cited by examiner

IMAGE SENSING DEVICE

CROSS-REFERENCE TO RELATED APPLICATION

This U.S. non-provisional patent application claims benefit of priority under 35 U.S.C. § 119 to Korean Patent Application No. 10-2017-0150547, filed on Nov. 13, 2017 in the Korean Intellectual Property Office, the disclosure of which is incorporated herein by reference in its entirety.

BACKGROUND

1. Field

The present disclosure relates to an image sensing device. More particularly, the present disclosure relates to an image sensing device that includes a separation structure and an electrode structure.

2. Description of Related Art

Image sensors for capturing images and converting images into electrical signals have been used in cameras mounted in automobiles, security devices, and robots, as well as in the camera modules of consumer electronics, such as digital cameras, cameras for mobile phones, and portable camcorders. These image sensors have required compact size and high resolution. Thus, research into how best to meet the requirement for compact size and high resolution has been conducted.

SUMMARY

An aspect of the present disclosure provides an image sensing device that includes a separation structure and electrode structures that are or can be formed simultaneously.

According to an aspect of the present disclosure, an image sensing device includes: a semiconductor substrate; a separation structure, and electrode structures. The separation structure is disposed within an opening passing through the semiconductor substrate. The electrode structures are disposed within holes passing through the semiconductor substrate. The separation structure includes a first conductive pattern and a first insulating spacer between the first conductive pattern and the semiconductor substrate. A respective one of the electrode structures includes a second conductive pattern, and a second insulating spacer between the second conductive pattern and the semiconductor substrate. The separation structure includes line portions extending in a first direction, and extension portions extending from the line portions in a second direction, perpendicular to the first direction. The electrode structures are disposed between the extension portions.

According to an aspect of the present disclosure, an image sensing device includes: a photoelectric device disposed within a semiconductor substrate; and a separation structure and electrode structures disposed within the semiconductor substrate, and surrounding the photoelectric device. The separation structure includes a first conductive pattern, and a first insulating spacer between the first conductive pattern and the semiconductor substrate. A respective one of the electrode structures includes a second conductive pattern, and a second insulating spacer between the second conductive pattern and the semiconductor substrate. The first conductive pattern and the second conductive pattern include the same conductive material.

According to an aspect of the present disclosure, an image sensing device includes: a semiconductor substrate, a photoelectric device, a front-side structure, a back-side structure, and a separation structure and electrode structures. The semiconductor substrate has a first surface and a second surface opposing each other. The photoelectric device is disposed within the semiconductor substrate. The front-side structure is disposed on a first surface of the semiconductor substrate. The back-side structure is disposed on a second surface of the semiconductor substrate. The separation structure and electrode structures are disposed within the semiconductor substrate, and surrounding the photoelectric device. The separation structure includes a first conductive pattern, and a first insulating spacer between the first conductive pattern and the semiconductor substrate. A respective one of the electrode structures includes a second conductive pattern, and a second insulating spacer between the second conductive pattern and the semiconductor substrate. The first conductive pattern and the second conductive pattern are formed of the same conductive material. The back-side structure includes: a color filter overlapping the photoelectric device; a first electrode disposed on the color filter; an organic photoelectric layer disposed on the first electrode; a second electrode disposed on the organic photoelectric layer; and a back-side contact plug electrically connecting the first electrode to the second conductive pattern.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Figure 1:
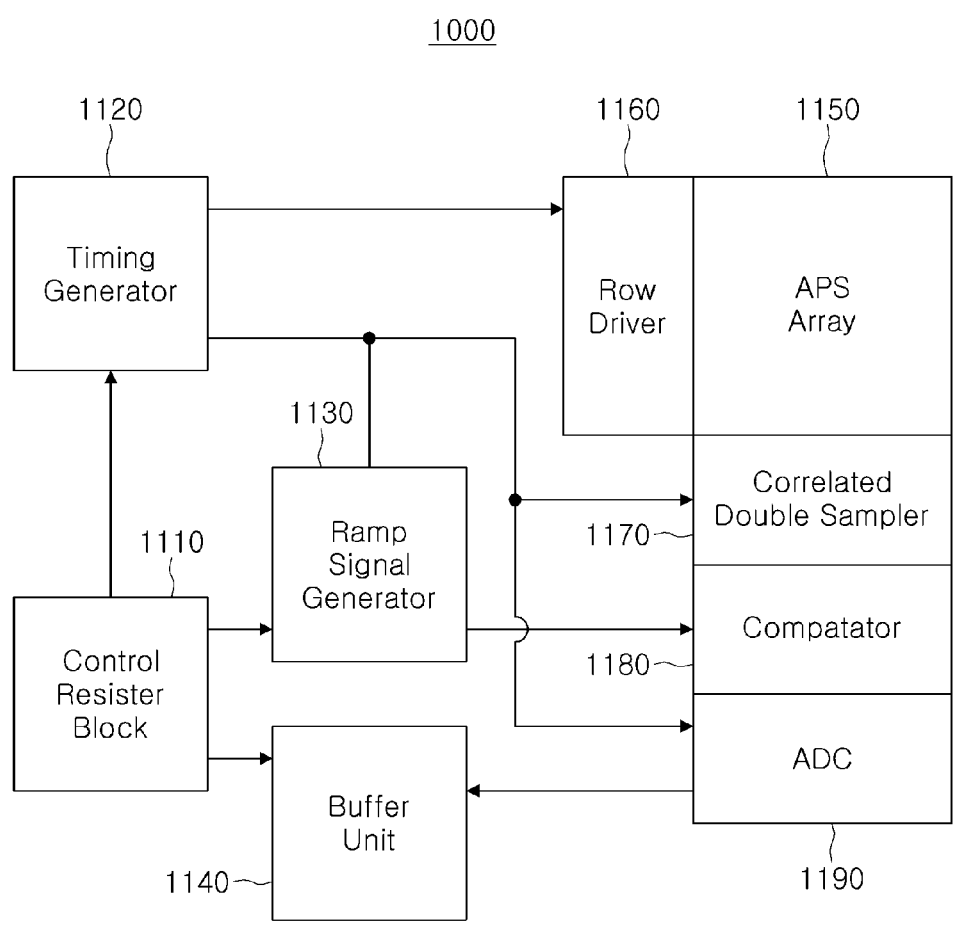
FIG. 1 is a block diagram illustrating an image sensing device, according to an example embodiment.

An example of an image sensing device, according to an example embodiment of the present disclosure, will be described with reference to FIG. 1. FIG. 1 is a block diagram illustrating an image sensing device, according to an example embodiment.

Referring to FIG. 1, an image sensing device 1000 includes a control register block 1110, a timing generator 1120, a ramp signal generator 1130, a buffer unit 1140, an APS array 1150 (active pixel sensor array), a row driver 1160, a correlated double sampler 1170, a comparator 1180, and an ADC 1190 (analog-to-digital converter).

The control register block 1110 may control the overall operations of the image sensing device 1000. For example, the control register block 1110 may transmit operating signals to the timing generator 1120, the ramp signal generator 1130, and the buffer unit 1140.

The timing generator 1120 may generate an operating timing reference signal for the various components of the image sensing device 1000.

The operating timing reference signal, generated by the timing generator 1120, may be transmitted to the row driver 1160, the correlated double sampler 1170, the comparator 1180, and/or the ADC 1190.

The ramp signal generator 1130 may generate and transmit a ramp signal used in the correlated double sampler 1170 and/or the comparator 1180.

The buffer unit 1140 may include a latch part. The buffer unit 1140 may temporarily store an image signal to be transmitted to an external source, and may transmit image data to an external device.

The APS array 1150 may sense an external image. The APS array 1150 may include multiple active pixels. The row driver 1160 may selectively activate rows of active pixels of the APS array 1150.

The correlated double sampler 1170 may sample and output an analog signal generated by the APS array 1150.

The comparator 1180 may compare data, transmitted from the correlated double sampler 1170, to a slope of a ramp signal, and the like, fed back as feedback according to analog reference voltages thereof, to generate various reference signals.

The ADC 1190 may convert analog image data into digital image data.

Figure 2:
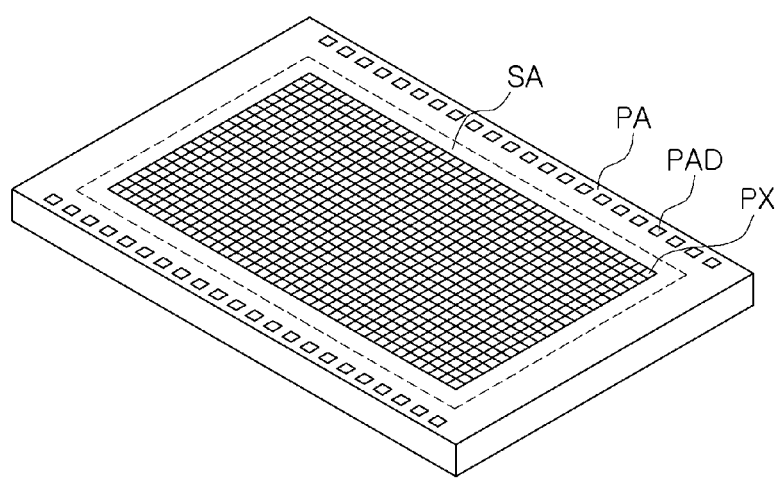
FIG. 2 is a view illustrating a schematic layout of an image sensing device, according to an example embodiment.

FIG. 2 is a view illustrating a schematic layout of an image sensing device, according to an example embodiment.

Referring to FIG. 2, an image sensing device 1000, according to an example embodiment, includes a pixel array region SA of an image sensor, and a peripheral region PA disposed around the pixel array region SA.

The pixel array region SA may be a region including the APS array 1150 described above with reference to FIG. 1. The pixel array region SA includes multiple pixel regions PX arranged in a matrix. The respective pixel regions PX may include a photoelectric device, such as a photodiode, and transistors.

The peripheral region PA includes pad regions PAD. The pad regions PAD may be configured to transmit an electrical signal to, or to receive an electrical signal from, an external device or the like.

In example embodiments, the pad regions PAD may serve to transmit driving power, such as a power supply voltage or a ground voltage, supplied from an external source, to circuits of the image sensing device 1000.

The image sensing device 1000, according to an example embodiment, may include a single package formed as a single chip including an image sensor chip, and/or a package having a stacked chip structure including multiple chips having a logic chip and/or a memory chip, together with an image sensor chip. In a modified example, the image sensing device 1000, according to an example embodiment, may also be fabricated by combining an image sensor package formed as an image sensor chip with a logic/memory package including a logic chip and/or a memory chip.

Figure 3A:
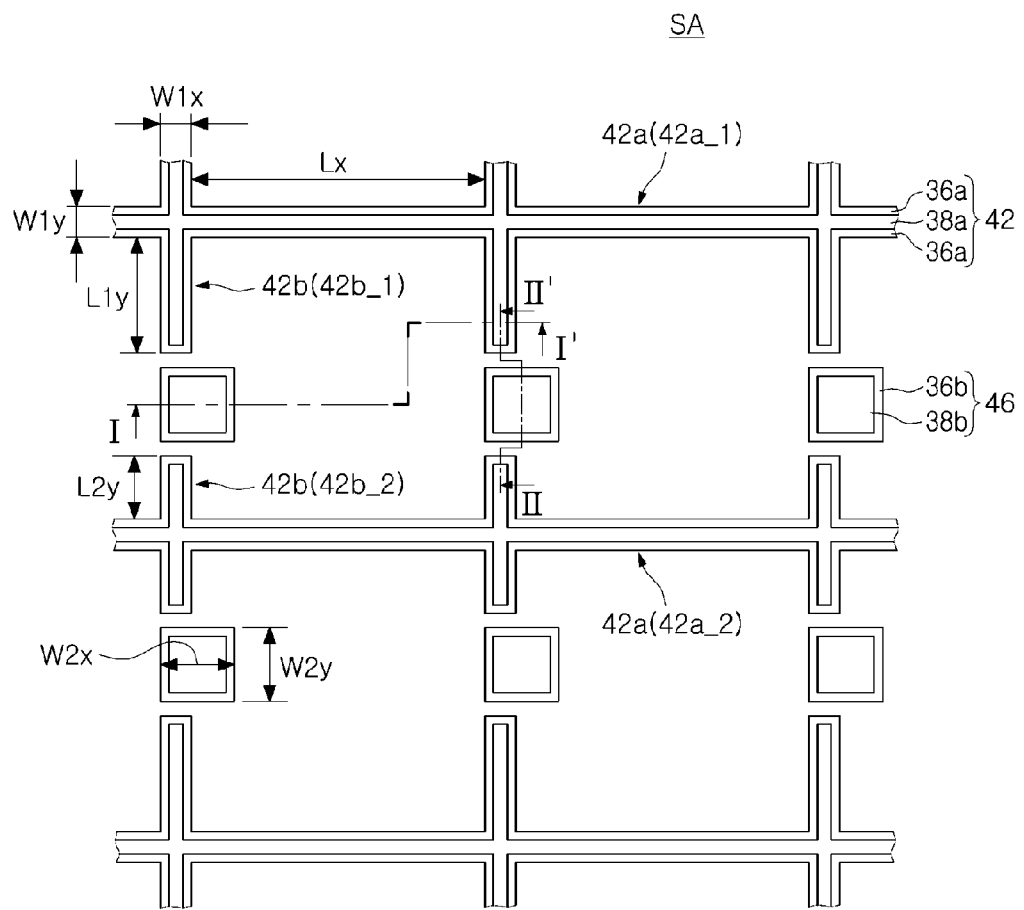
FIGS. 3A and 3B are plan views of the image sensing device, according to an example embodiment.

An example of an image sensing device, according to an example embodiment, will be described with reference to FIG. 3A. FIG. 3A is a plan view illustrating a portion of the pixel array region SA of the image sensing device 1000 of FIG. 2, according to an example embodiment.

Referring to FIG. 3A, the image sensing device 1000, according to an example embodiment, includes a separation structure 42 and electrode structures 46.

The separation structure 42 may separate another element of the image sensing device 1000 from others, such as by fully or partially surrounding the other element. As an example, the separation structure may, together with the electrode structures 46, surround a photoelectric device SPD as described for embodiments below.

The separation structure 42 includes a first conductive pattern 38a, and a first insulating spacer 36a disposed on one or more lateral surfaces of the first conductive pattern 38a. Each of the electrode structures 46 includes a second conductive pattern 38b, and a second insulating spacer 36b disposed on a lateral surface of the second conductive pattern 38b.

The separation structure 42 includes line portions 42a extending in a first direction X, and extension portions 42b extending from the line portions 42a in a second direction Y, perpendicular to the first direction X. The line portions 42a are unbroken across multiple electrode structures 46 in the first direction X, whereas the extension portions 42b are separated by the electrode structures 46 in the second direction Y.

The electrode structures 46 may be disposed between the extension portions 42b. In an example embodiment, the electrode structures 46 may be biased in the first direction X between the extension portions 42b of the separation structure 42. That is, the electrode structures 46 may not be perfectly centered between extension portions 42b, and may instead be biased and off-center as shown in FIG. 3A.

In an example embodiment, the width of each of the electrode structures 46 in the first direction X or the second direction Y may be the same or substantially the same, such as within 10% of one another. Additionally, the width of each of the electrode structures 46 in the first direction X or the second direction Y (see below) may be less than the length Lx of each of the line portions 42a in the first direction X, and may be greater than the width W1y of each of the line portions 42a in the second direction Y. The width of each of the electrode structures 46 may be a width W2x in the first direction X or a width W2y in the second direction Y.

In an example embodiment, the width W2x of each of the electrode structures 46 in the first direction X, or the width W2y of each of the electrode structures 46 in the second direction Y, may be greater than the width W1x of each of the extension portions 42b in the first direction X. That is, the electrode structures 46 may have a greater width than the extension portions 42b.

In an example embodiment, a distance between the extension portions 42b and the electrode structures 46 in the second direction Y may be less than the width W1x of the extension portions 42b in the first direction X.

In an example embodiment, the distance between the extension portions 42b and the electrode structures 46 may be less than the width W1y of the line portions 42a in the second direction Y.

In an example embodiment, the extension portions 42b includes a first extension portion 42b_1 and a second extension portion 42b_2 extending by different lengths.

In an example embodiment, the length L1y of the first extension portion 42b_1 in the second direction Y may be greater than the length L2y of the second extension portion 42b_2 in the second direction Y.

In an example embodiment, the width W2y of each of the electrode structures 46 in the second direction Y may be less than the length L1y of the first extension portion 42b_1 in the second direction Y.

In an example embodiment, the width W2y of each of the electrode structures 46 in the second direction Y may be greater than the length L2y of the second extension portion 42b_2 in the second direction Y.

In an example embodiment, the line portions 42a includes a first line portion 42a_1 and a second line portion 42a_2 parallel and adjacent to each other.

In an example embodiment, the first extension portion 42b_1 may extend from the first line portion 42a_1, and the second extension portion 42b_2 may extend from the second line portion 42a_2.

In an example embodiment, between the first line portion 42a_1 and second line portion 42a_2, the electrode structures 46 may be disposed closer to the second line portion 42a_2 than to the first line portion 42a_1.

Figure 3B:
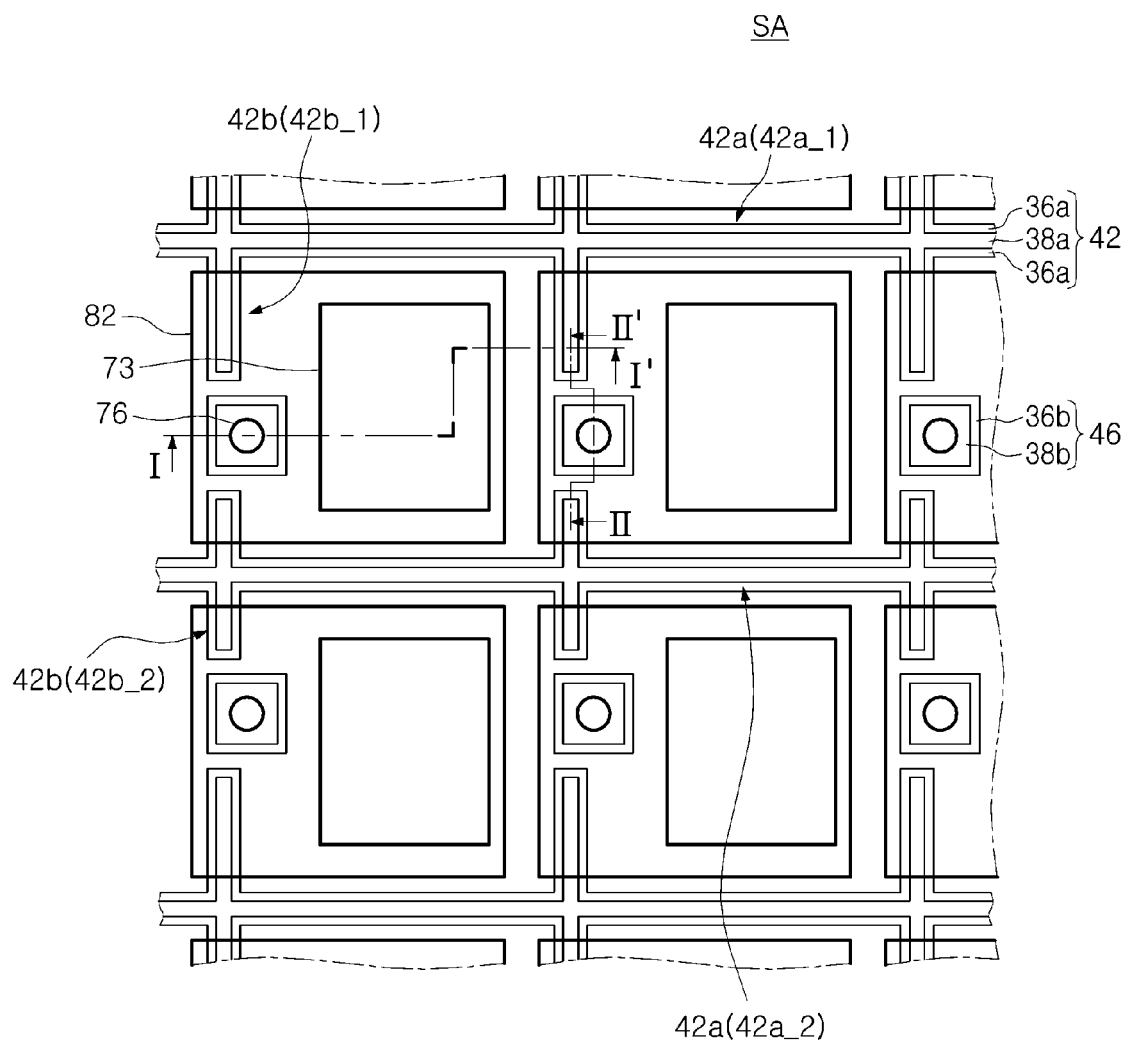
Figure 4:
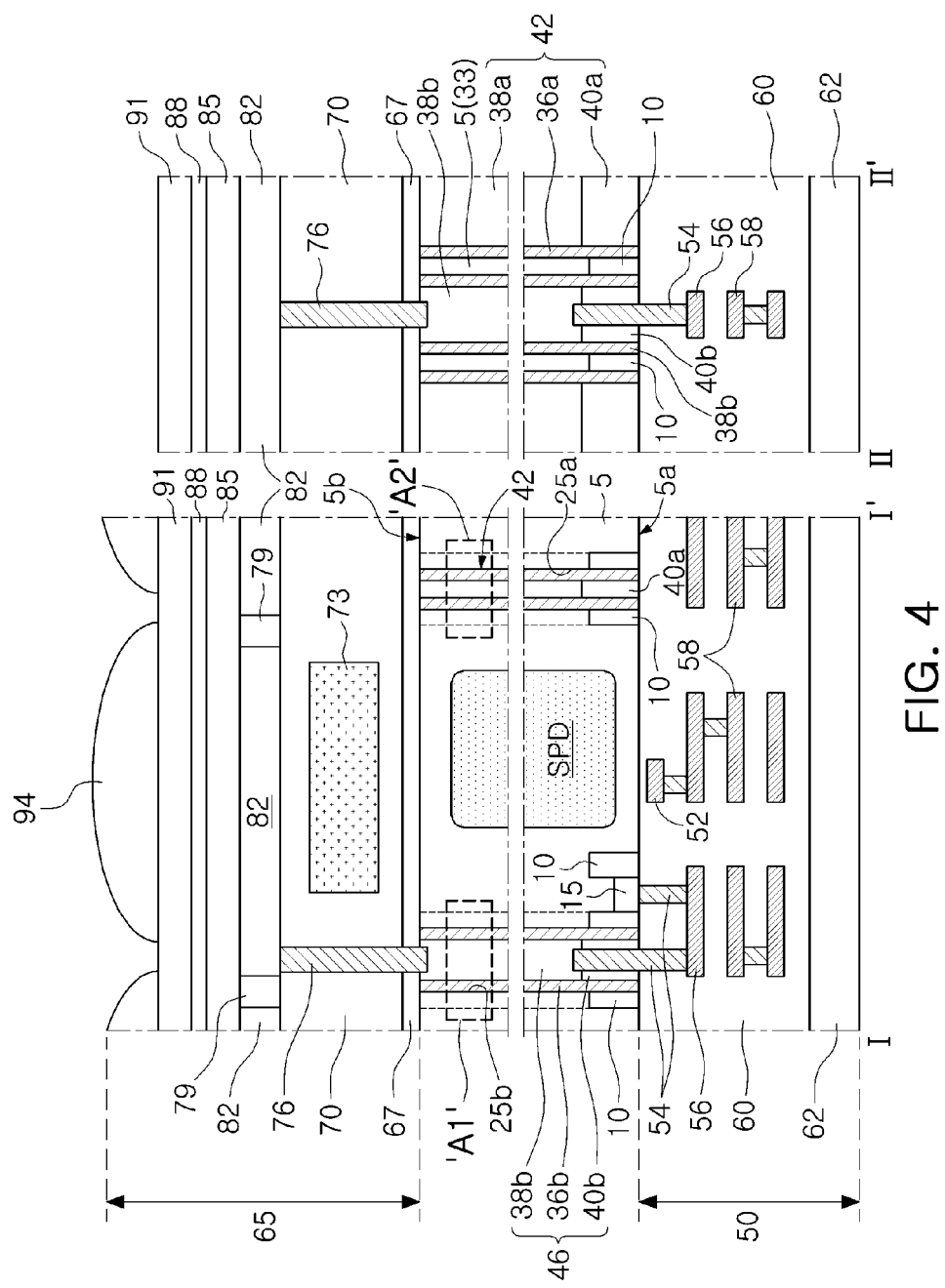
FIG. 4 illustrates cross-sectional views of an example of an image sensing device, according to an example embodiment.
Figure 5:
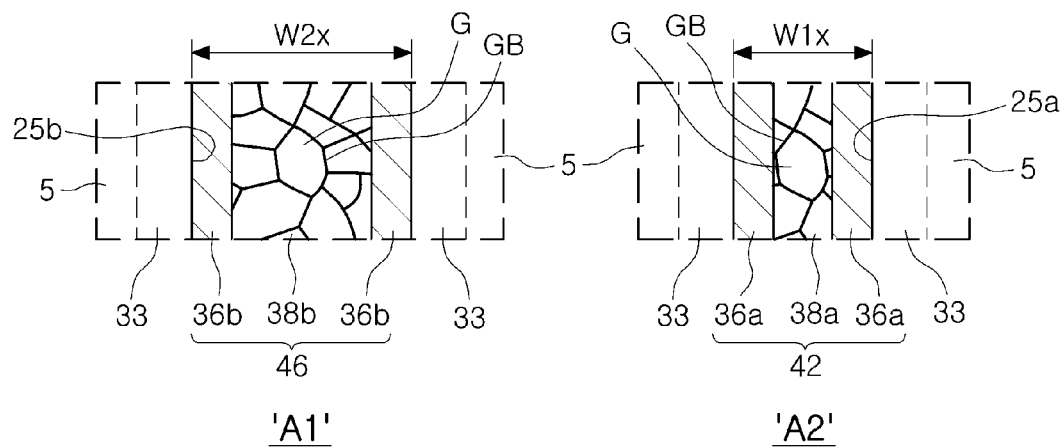
FIG. 5 illustrates partially enlarged cross-sectional views of regions of FIG. 4.

Examples of the image sensing device, according to an example embodiment, will be described with reference to FIGS. 3A, 3B, 4, and 5. FIG. 3A is a plan view illustrating the example of an image sensing device, according to an example embodiment. FIG. 3B is a plan view in which some constituent elements are further added to the plan view illustrated in FIG. 3A. FIG. 4 illustrates cross-sectional views taken along lines I-I' and II-II' of FIGS. 3A and 3B. FIG. 5 illustrates partially enlarged views of regions "A1" and "A2" of FIG. 4.

Referring to FIGS. 3A, 3B, 4, and 5, a semiconductor substrate 5 has a first surface 5a and a second surface 5b opposing each other on opposite and opposing extremities of the semiconductor substrate 5. The semiconductor substrate 5 may be a semiconductor substrate formed of a semiconductor material, such as silicon.

In the specification, the term "first surface" may be replaced with the term "front side," and the term "second surface" may be replaced with the term "back side."

A photoelectric device SPD may be disposed within the semiconductor substrate 5. The photoelectric device SPD may be a photodiode or a silicon photoelectric conversion device formed within a semiconductor substrate including silicon or the like. The photoelectric device SPD may serve to convert light incident to the photoelectric device SPD into an electrical signal.

In the specification, the term "photoelectric device" may be replaced with the term "photodiode" or "silicon photoelectric conversion device."

A shallow trench isolation region 10 may be disposed on the first surface 5a of the semiconductor substrate 5. The shallow trench isolation region 10 may be formed of an insulating material, such as a silicon oxide and/or a silicon nitride.

Storage node regions 15 may be disposed within portions of the semiconductor substrate 5 defined by the shallow trench isolation region 10. The storage node regions 15 may have a different conductivity type than the semiconductor substrate 5. For example, the semiconductor substrate 5 may have p-type conductivity, and the storage node regions 15 may have n-type conductivity.

As described above with reference to FIG. 3A, the separation structure 42 and the electrode structures 46 may be disposed within the semiconductor substrate 5. Thus, the first conductive pattern 38a and the first insulating spacer 36a of the separation structure 42, and the second conductive pattern 38b and the second insulating spacer 36b of the electrode structures 46 may be disposed within the semiconductor substrate 5. The separation structure 42 and the electrode structures 46 may surround the photoelectric device SPD.

In an example embodiment, the first direction X and the second direction Y described above with reference to FIG. 3 may be directions parallel to the first surface 5a and the second surface 5b of the semiconductor substrate 5. That is, the first surface 5a and the second surface 5b may be in parallel planes each defined or definable by the first direction X and the second direction Y. A third direction Z illustrated in FIGS. 3A and 3B may be a direction perpendicular to the first surface 5a and the second surface 5b of the semiconductor substrate 5.

The separation structure 42 may be disposed within an opening 25a, passing through the semiconductor substrate 5. The electrode structures 46 may be disposed within holes 25b passing through the semiconductor substrate 5.

The opening 25a, or the holes 25b, or both, may pass through the shallow trench isolation region 10. Thus, the electrode structures 46, or the separation structure 42, or both, may pass through the shallow trench isolation region 10.

The first insulating spacer 36a may be disposed between the first conductive pattern 38a and the semiconductor substrate 5. The second insulating spacer 36b may be disposed between the second conductive pattern 38b and the semiconductor substrate 5.

The first insulating spacer 36a and second insulating spacer 36b may be formed of the same insulating material. The first insulating spacer 36a and second insulating spacer 36b may be formed of silicon oxides.

The first insulating spacer 36a and second insulating spacer 36b may be formed of the same conductive material. For example, the first conductive pattern 38a and second conductive pattern 38b may have the same conductivity type, and may be formed of doped polycrystalline silicon having the same impurity concentration. For example, the first conductive pattern 38a and second conductive pattern 38b may be formed of doped polycrystalline silicon having p- or n-type conductivity.

In an example embodiment, since the first conductive pattern 38a and second conductive pattern 38b, which may be formed of doped polycrystalline silicon including grains G (see FIG. 5) and grain boundaries GB (see FIG. 5) between the grains G, may be formed in the same process, the first conductive pattern 38a and second conductive pattern 38b may include the grains G having the same size.

An impurity region 33 may be formed to extend from side walls of the opening 25a and the holes 25b into the semiconductor substrate 5. The impurity region 33 may reduce a dark level of the image sensing device 1000 to increase the performance of the image sensing device 1000.

In an example embodiment, the impurity region 33 may have a different conductivity type, for example, p-type conductivity, than a portion of the photoelectric device SPD having n-type conductivity. For example, the impurity region 33 may contain p-type impurities, such as boron (B).

In an example embodiment, a doping profile of the impurity region 33 may be different from that of the semiconductor substrate 5 adjacent to the impurity region 33. For example, at least a portion of the semiconductor substrate 5 adjacent to the impurity region 33 may be a region having p-type conductivity. The impurity region 33 may have a higher impurity concentration than the region of the semiconductor substrate 5 adjacent to the impurity region 33. The impurity region 33 may be distinct from the semiconductor substrate 5 by impurity concentration or doping profile.

In an example embodiment, a doping profile of a portion of the impurity region 33 formed by spreading the impurities into the semiconductor substrate 5 from the side walls of the holes 25b, and a doping profile of a portion of the impurity region 33 formed by spreading the impurities into the semiconductor substrate 5 from the side wall of the opening 25a, may be substantially the same. For example, a first doping depth may be of a portion of the impurity region 33 formed by spreading the impurities into the semiconductor substrate 5 from the side walls of the holes 25b in a direction perpendicular to the side walls of the holes 25b. A second doping depth may be of a portion of the impurity region 33 formed by spreading the impurities into the semiconductor substrate 5 from the side wall of the opening 25a in a direction perpendicular to the side wall of the opening 25a. The first doping depth and the second doping depth may be substantially the same.

A front-side structure 50 may be disposed on the first surface 5a of the semiconductor substrate 5.

The front-side structure 50 may include a circuit required for operations of the image sensing device 1000. The front-side structure 50 may include a gate wiring 52 that may constitute a gate electrode of a circuit in a region of the front-side structure 50 facing the semiconductor substrate 5. The front-side structure 50 includes a connection wiring 56 and front-side contact plugs 54. The front-side contact plugs 54 may electrically connect the connection wiring 56 to the second conductive pattern 38b, and may electrically connect the connection wiring 56 to the storage node region 15. Thus, the front-side contact plugs 54 and the connection wiring 56 may electrically connect the second conductive pattern 38b of the electrode structures 46 to the storage node region 15. The front-side structure 50 may be disposed on the first surface 5a of the semiconductor substrate 5, and includes front wirings 58 required for the circuit of the image sensing device 1000. The front-side structure 50 may be formed on the first surface 5a of the semiconductor substrate 5, and includes a front insulating material 60 covering the gate wiring 52, the connection wiring 56, and the front-side contact plugs 54. The front-side structure 50 includes a support layer 62 disposed on the front insulating material 60. The support layer 62 may be used to ensure strength of the semiconductor substrate 5. The support layer 62 may be formed of a silicon oxide, a silicon nitride, and/or a semiconductor material.

A back-side structure 65 may be disposed on the second surface 5b of the semiconductor substrate 5.

The back-side structure 65 includes an anti-reflective layer 67 disposed on the second surface 5b of the semiconductor substrate 5, a first insulating layer 70 disposed on the anti-reflective layer 67, and color filters 73 embedded in the first insulating layer 70. The color filters 73 may overlap the photoelectric devices SPD.

The anti-reflective layer 67 may prevent reflection of light directing toward the photoelectric device SPD from an external source, for example, reflection of light from the second surface 5b of the semiconductor substrate 5, so as to increase transmissivity of light directing into the photoelectric device SPD.

In an example embodiment, the color filters 73 may include a red color filter and a blue color filter. For example, the color filter 73 may include a red color filter able to pass light having a red wavelength so that the red wavelength may reach the photoelectric device SPD, and a blue color filter able to pass light having a blue wavelength so that the blue wavelength may reach the photoelectric device SPD.

The back-side structure 65 includes first electrodes 82 disposed on the first insulating layer 70, a second insulating layer 79 surrounding lateral surfaces of the first electrodes 82, and back-side contact plugs 76 electrically connecting the first electrodes 82 to the second conductive pattern 38b. The first electrodes 82 includes portions overlapping the color filters 73.

The first electrodes 82 may be a transparent electrode. For example, the first electrodes 82 may be formed of a transparent conductive material, such as ITO, IZO, ZnO, $SnO_2$, an antimony-doped tin oxide (ATO), an aluminum-doped zinc oxide (AZO), a gallium-doped zinc oxide (GZO), $TiO_2$, or a fluorine-doped tin oxide (FTO).

The back-side structure 65 includes a photoelectric layer 85 disposed on the first electrodes 82, a second electrode 88 disposed on the photoelectric layer 85, an insulating cover layer 91 disposed on the second electrode 88, and microlenses 94 disposed on the insulating cover layer 91.

In an example embodiment, the photoelectric layer 85 may be an organic photoelectric layer. For example, the photoelectric layer 85 may be an organic photoelectric layer formed of an organic material undertaking photoelectric conversion only of light of a particular wavelength. For example, the photoelectric layer 85 may include a p-type layer having holes as main carriers, and an n-type layer having electrons as main carriers. The photoelectric layer 85 may generate electric charges, in response to light in a specific wavelength band, and as an example, may generate electric charges, in response to green light. In this case, light having different colors, for example, blue and red, other than green may be transferred to the photoelectric device SPDs through the color filters 73.

The second electrode 88 may be formed as a transparent electrode. For example, the second electrode 88 may be formed of a transparent conductive material, such as ITO, IZO, ZnO, $SnO_2$, ATO, AZO, GZO, $TiO_2$, or FTO.

In an example embodiment, the photoelectric layer 85 and the first electrode 82 and second electrode 88 may form an organic photoelectric device or an organic photoelectric conversion device. Electric charges generated by the photoelectric layer 85 in response to green light may be accumulated in the storage node regions 15 through the first electrodes 82, the back-side contact plugs 76, the second conductive patterns 38b within the electrode structures 46, the front-side contact plugs 54, and the connection wiring 56.

In the specification, the term "photoelectric device SPD" may be replaced with the term "first photoelectric device" or "silicon photoelectric conversion device," and a photoelectric device that may include the photoelectric layer 85 and the first electrode 82 and second electrode 88 may be replaced with the term "second photoelectric device," "organic photoelectric device," or "organic photoelectric conversion device."

The microlenses 94 may overlap the color filters 73. The microlenses 94 may redirect a path of light incident to a region, except for the photoelectric devices SPD, to concentrate the light on the photoelectric devices SPD.

Example embodiments of the present disclosure are not limited to the example embodiments described above with reference to FIGS. 3A, 3B, 4, and 5, and may be variously modified. With reference to FIGS. 6 to 11, various modified examples of the example embodiment of the present disclosure will be described hereinafter.

Figure 6:
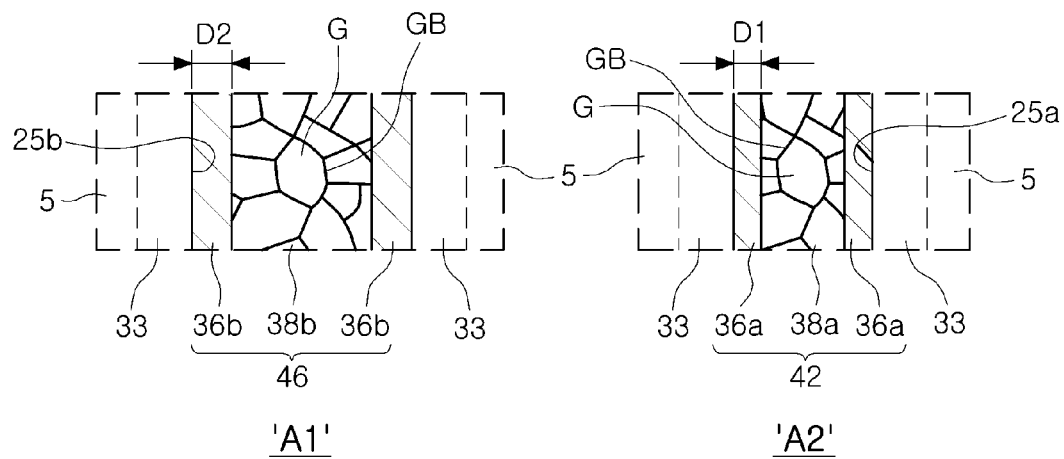
FIG. 6 illustrates partially enlarged cross-sectional views of modified examples of the regions of FIG. 4.

In an example embodiment, the first insulating spacer 36a and second insulating spacer 36b may have the same thickness, as illustrated in FIG. 5. However, example embodiments of the present disclosure are not limited thereto. For example, the first insulating spacers and second insulating spacer 36b may have different thicknesses, as illustrated in FIG. 6. For example, the thickness D1 of the first insulating spacer 36a may be less than the thickness D2 of the second insulating spacer 36b, as illustrated in FIG. 6. FIG. 6 illustrates partially enlarged cross-sectional views of modified examples of regions "A1" and "A2" of FIG. 4.

Figure 7:
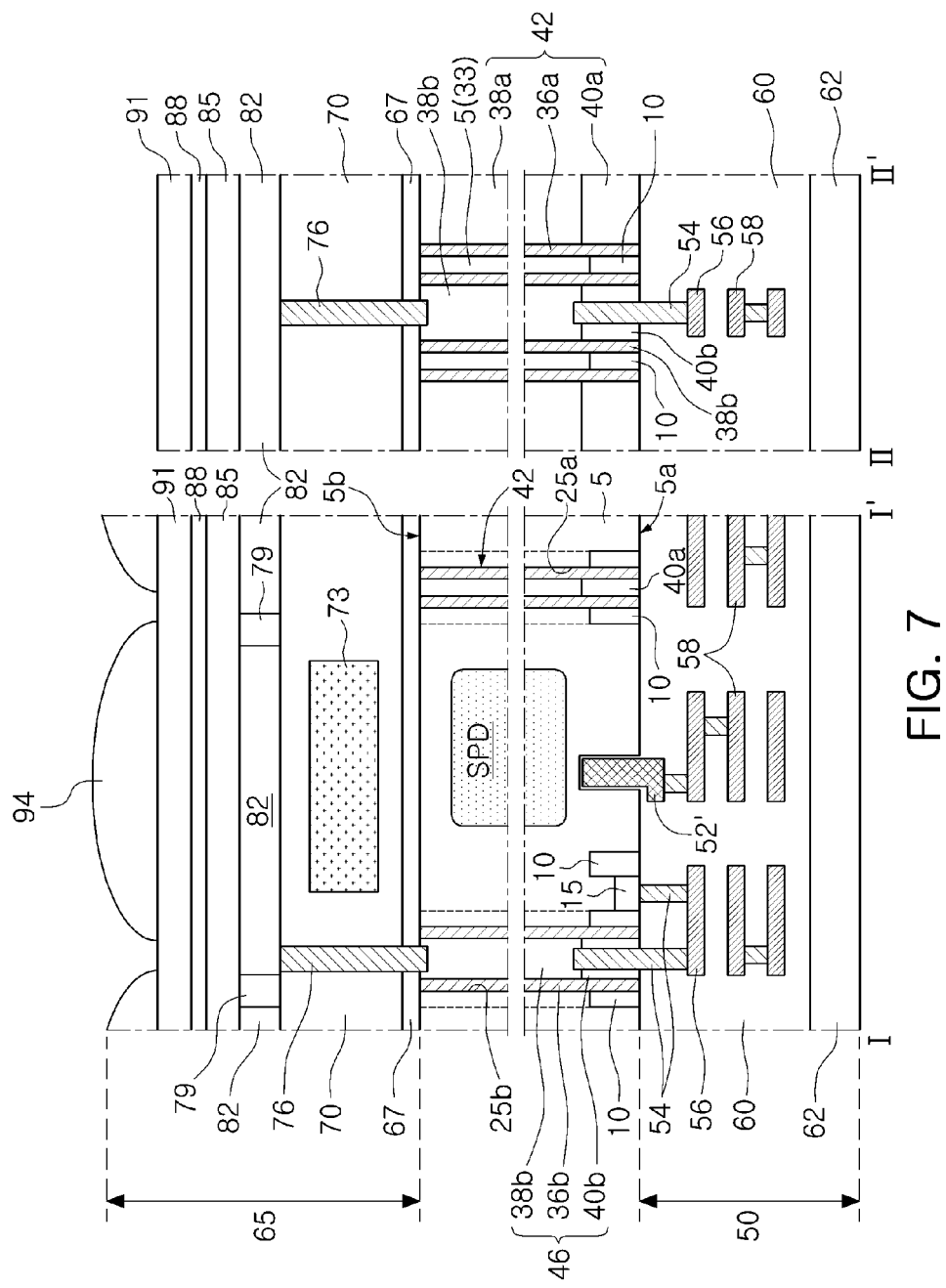
FIG. 7 illustrates cross-sectional views of a modified example of an image sensing device, according to an example embodiment.

In an example embodiment, the gate wiring 52 may be parallel to the first surface 5a of the semiconductor substrate 5. However, example embodiments of the present disclosure are not limited thereto. For example, at least a portion of a gate wiring 52' may be modified to extend from the first surface 5a of the semiconductor substrate 5 into the semiconductor substrate 5, as illustrated in FIG. 7. FIG. 7 illustrates cross-sectional views of a modified example of an image sensing device, according to an example embodiment.

Figure 8:
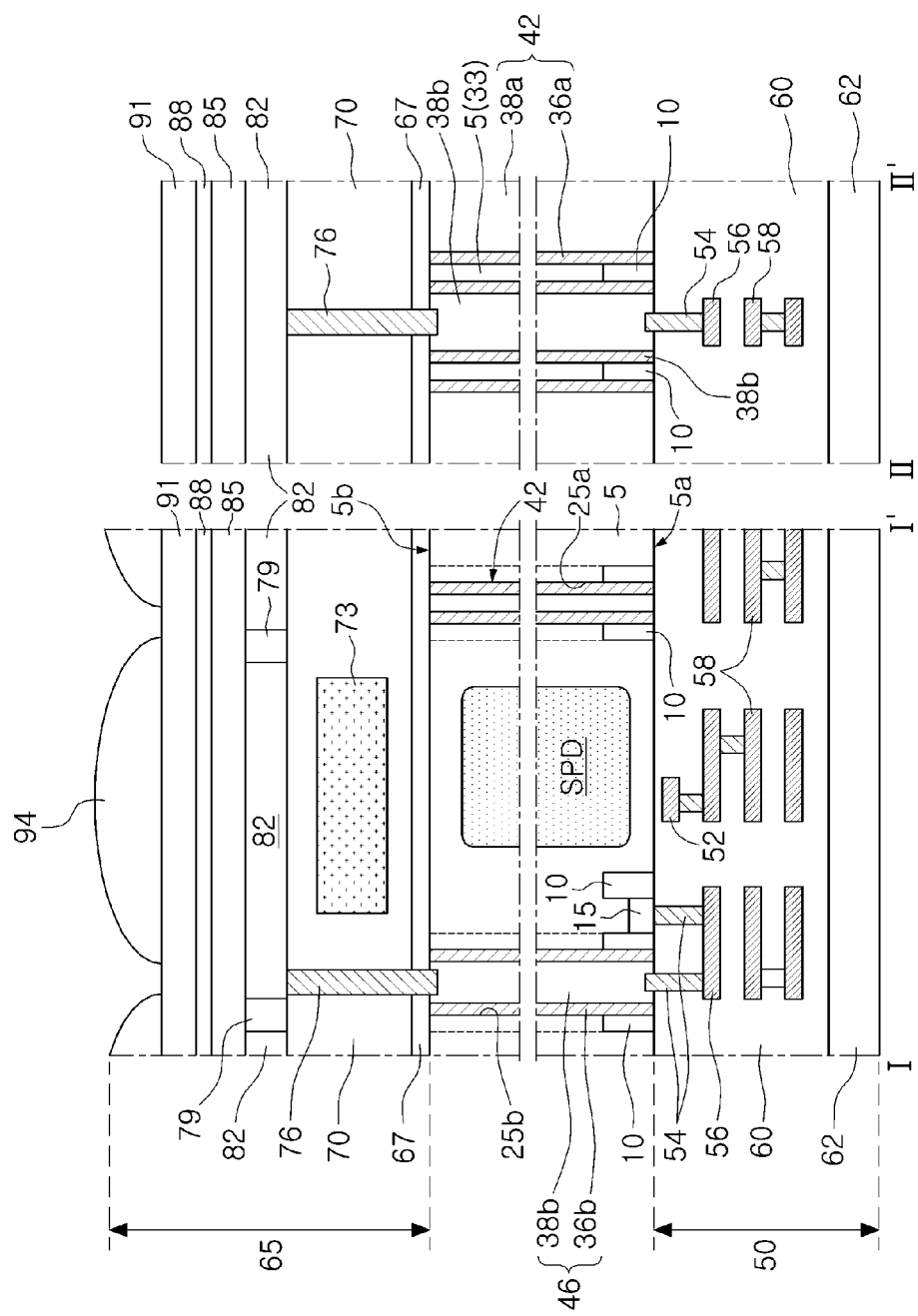
FIG. 8 illustrates cross-sectional views of a modified example of an image sensing device, according to an example embodiment.

In an example embodiment, the first conductive pattern 38a and second conductive pattern 38b may not pass through the shallow trench isolation region 10. However, example embodiments of the present disclosure are not limited thereto. For example, as illustrated in FIG. 8, first insulating capping pattern 40a and second insulating capping pattern 40b of FIG. 4 may be removed, and the first conductive pattern 38a and second conductive pattern 38b may pass through the semiconductor substrate 5, and may also pass through the shallow trench isolation region 10. FIG. 8 illustrates cross-sectional views of a modified example of an image sensing device, according to an example embodiment.

Figure 9:
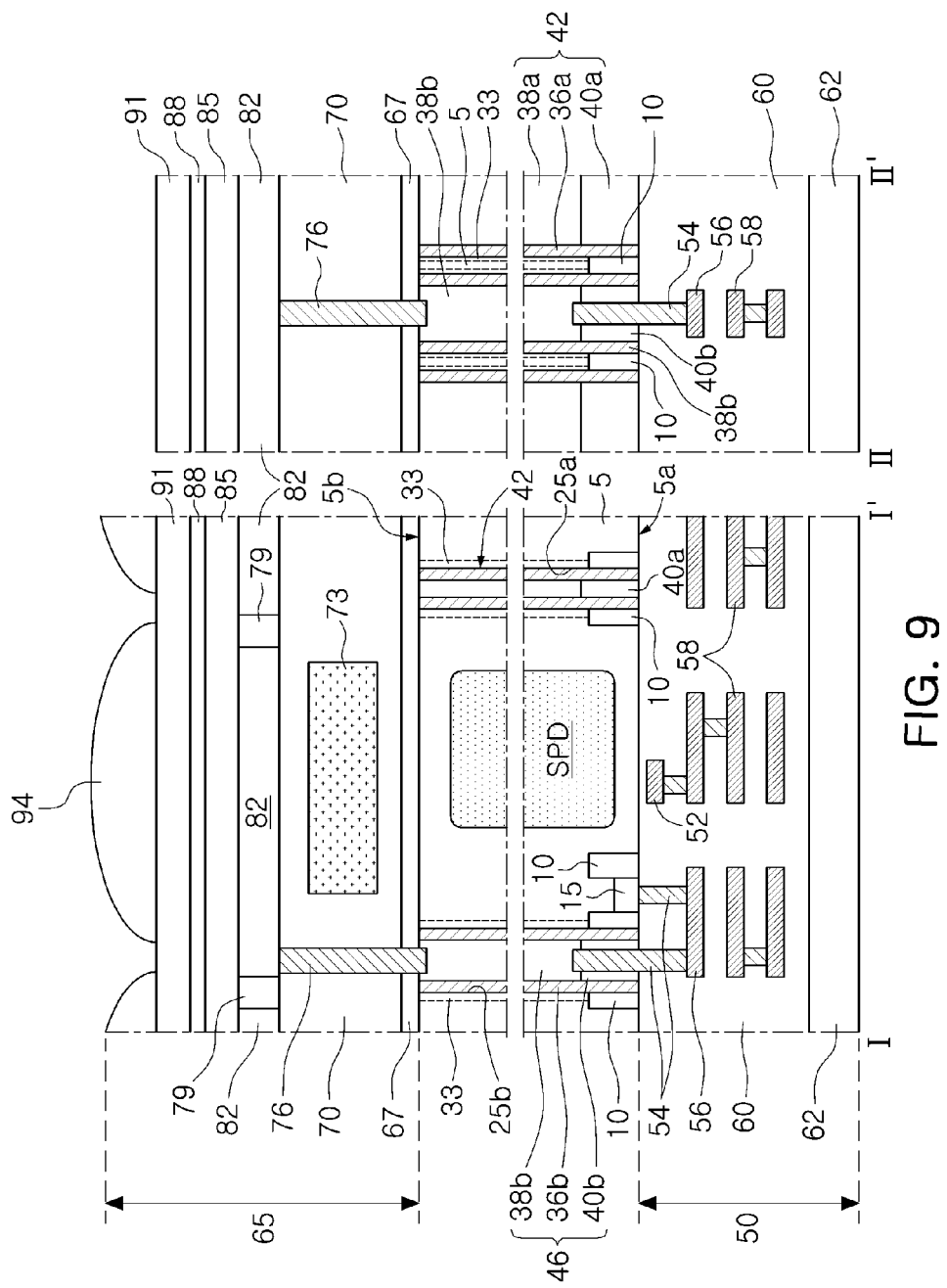
FIG. 9 illustrates cross-sectional views of a modified example of an image sensing device, according to an example embodiment.

In an example embodiment, a portion of the semiconductor substrate 5 positioned between the extension portions 42b of the separation structure 42 and the electrode structures 46 may be formed as the impurity region 33. However, example embodiments of the present disclosure are not limited thereto. For example, the portion of the semiconductor substrate 5 positioned between the extension portions 42b of the separation structure 42 and the electrode structures 46 may not be formed as the impurity region 33, as illustrated in FIG. 9. For example, in the impurity region 33 positioned between the extension portions 42b of the separation structure 42 and the electrode structures 46, as illustrated in FIG. 9, a first portion of the impurity region 33 may be formed within a portion of the semiconductor substrate 5 adjacent to the extension portions 42b, and a second portion of the impurity region 33 may be formed within a portion of the semiconductor substrate 5 adjacent to the electrode structures 46. The first portion and the second portion may be spaced apart from each other. FIG. 9 illustrates cross-sectional views of a modified example of an image sensing device, according to an example embodiment.

Figure 10:
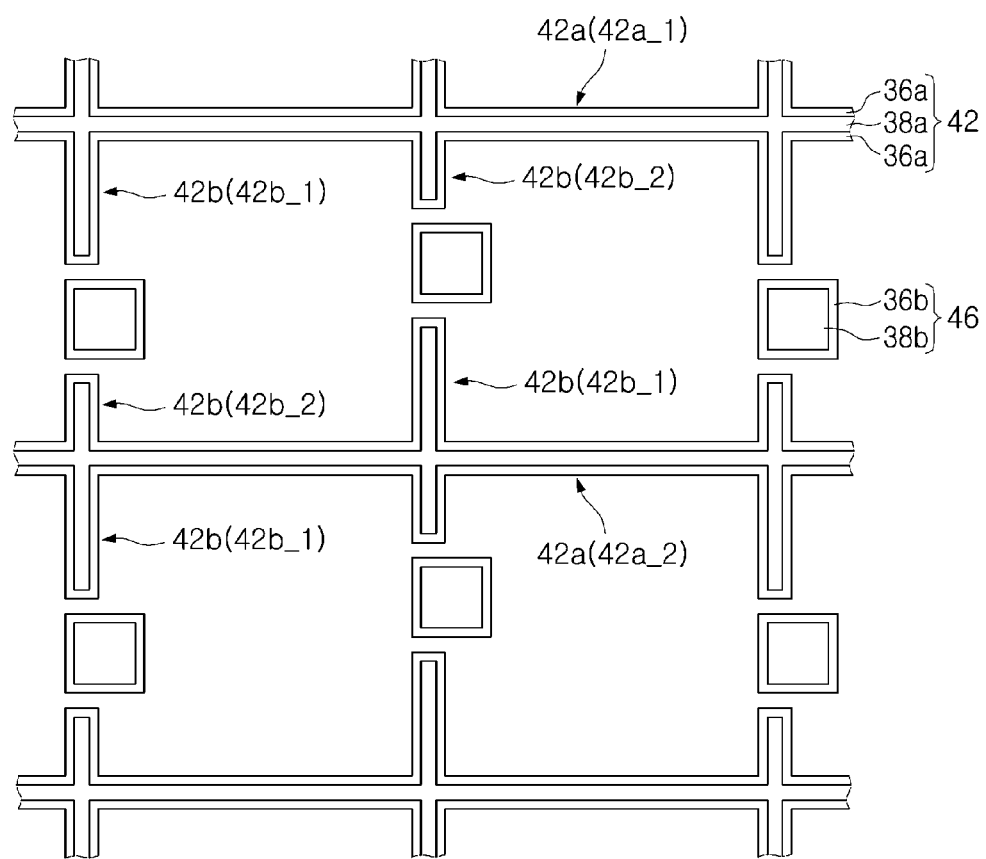
FIG. 10 is a plan view illustrating a modified example of an image sensing device, according to an example embodiment.
Figure 10:
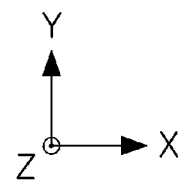
Figure 11:
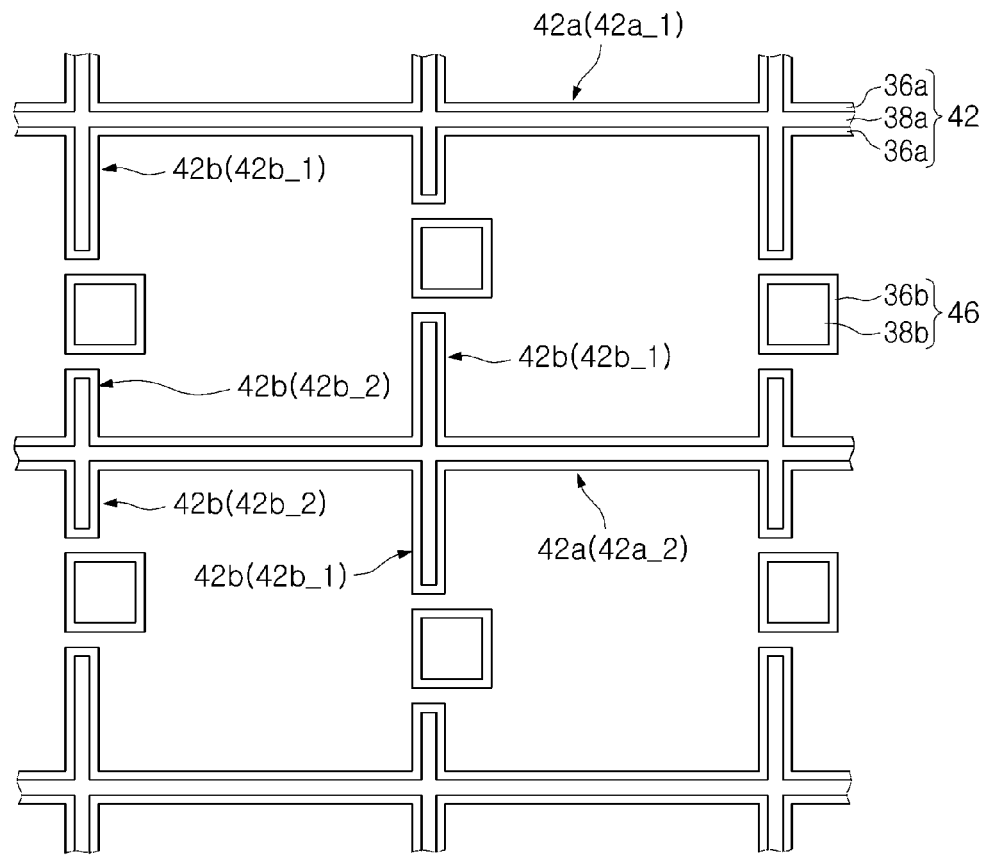
FIG. 11 is a plan view illustrating a modified example of an image sensing device, according to an example embodiment.

In an example embodiment, between the first line portion 42a_1 and second line portion 42a_2 of the separation structure 42, the electrode structures 46 may be disposed closer to the second line portion 42a_2 than to the first line portion 42a_1. However, example embodiments of the present disclosure are not limited thereto. For example, between the first line portion 42a_1 and second line portion 42a_2, a portion of the electrode structures 46 (i.e., but not the entirety of the electrode structures 46) may be disposed closer to the second line portion 42a_2 than to the first line portion 42a_1. The remainder of the electrode structures 46 may be disposed closer to the first line portion 42a_1 than to the second line portion 42a_2, as illustrated in FIG. 10 or 11. FIGS. 10 and 11 are plan views illustrating modified examples of the image sensing device, according to an example embodiment.

In an example embodiment, as described above with reference to FIG. 3A, in the first extension portion 42b_1 and second extension portion 42b_2 having different lengths, of the separation structure 42, the first extension portion 42b_1, having a relatively greater length than the second extension portion 42b_2, may extend from the first line portion 42a_1, and the second extension portion 42b_2 having a relatively shorter length than the first extension portion 42b_1 may extend from the second line portion 42a_2. However, example embodiments of the present disclosure are not limited thereto. For example, the first extension portion 42b_1 and second extension portion 42b_2 may extend from the first line portion 42a_1, and may extend from the second line portion 42a_2. For example, the first extension portion 42b_1 and second extension portion 42b_2 may extend from one of the first line portion 42a_1 and second line portion 42a_2 in positive and negative directions of the second direction Y.

Figure 12:
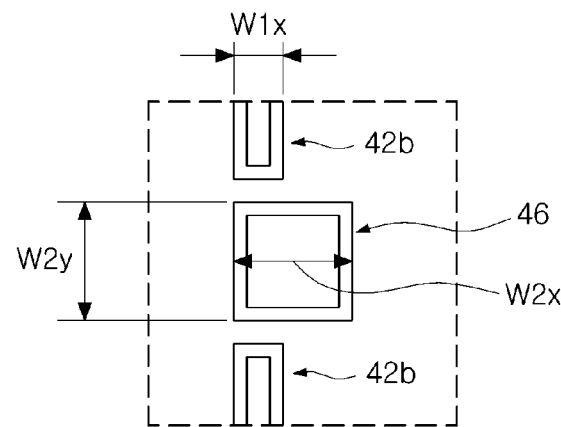
FIG. 12 is a plan view illustrating a portion of FIG. 3A.

FIG. 12 is a plan view illustrating a portion of FIG. 3A. Referring to FIGS. 3A and 12, one of the electrode structures 46 may be positioned between the extension portions 42b of the separation structure 42. Modified examples of the electrode structure 46, as described above, will be described with reference to FIGS. 13 and 14.

Figure 13:
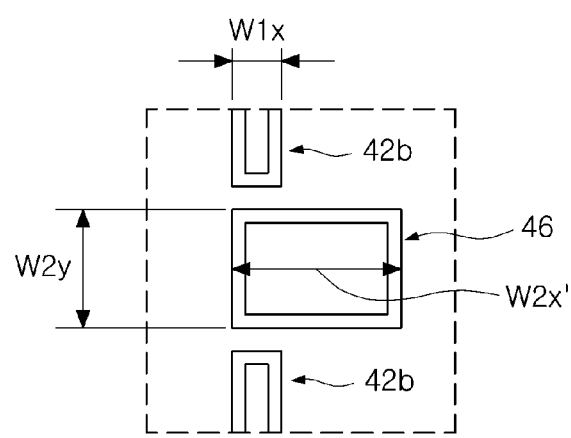
FIG. 13 is a plan view illustrating a modified example of an image sensing device, according to an example embodiment.

In an example embodiment, the width W2x of the electrode structure 46 in the first direction X may be the same as the width W2y thereof in the second direction Y. However, example embodiments of the present disclosure are not limited thereto. For example, the width W2x' of the electrode structure 46 in the first direction X may be greater than the width W2y thereof in the second direction Y, as illustrated in FIG. 13.

Figure 14:
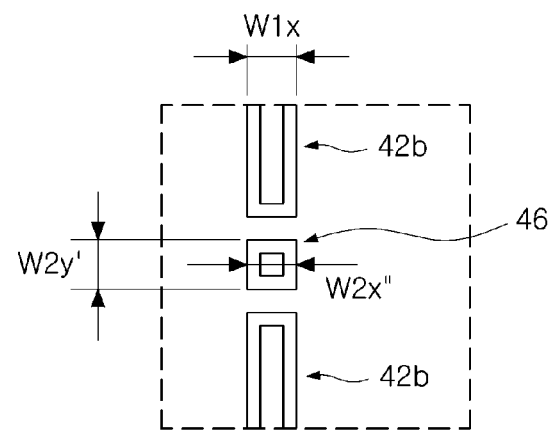
FIG. 14 is a plan view illustrating a modified example of an image sensing device, according to an example embodiment.

In an example embodiment, the width W2x of the electrode structure 46 in the first direction X or the width W2y thereof in the second direction Y may be greater than the width W1x of each of the extension portions 42b in the first direction X. However, example embodiments of the present disclosure are not limited thereto. For example, the width W2$x''$ of the electrode structure 46 in the first direction X and/or the width W2$y'$ thereof in the second direction Y may be the same as the width W1$x$ of each of the extension portions 42$b$ in the first direction X, as illustrated in FIG. 14.

Figure 15:
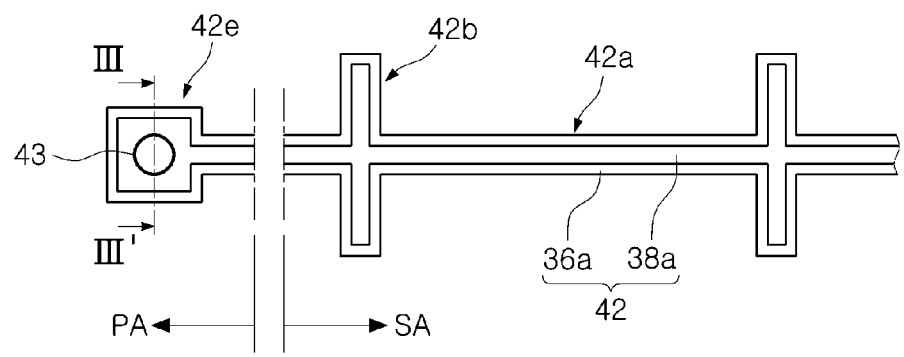
FIG. 15 is a plan view illustrating a modified example of an image sensing device, according to an example embodiment.
Figure 16:
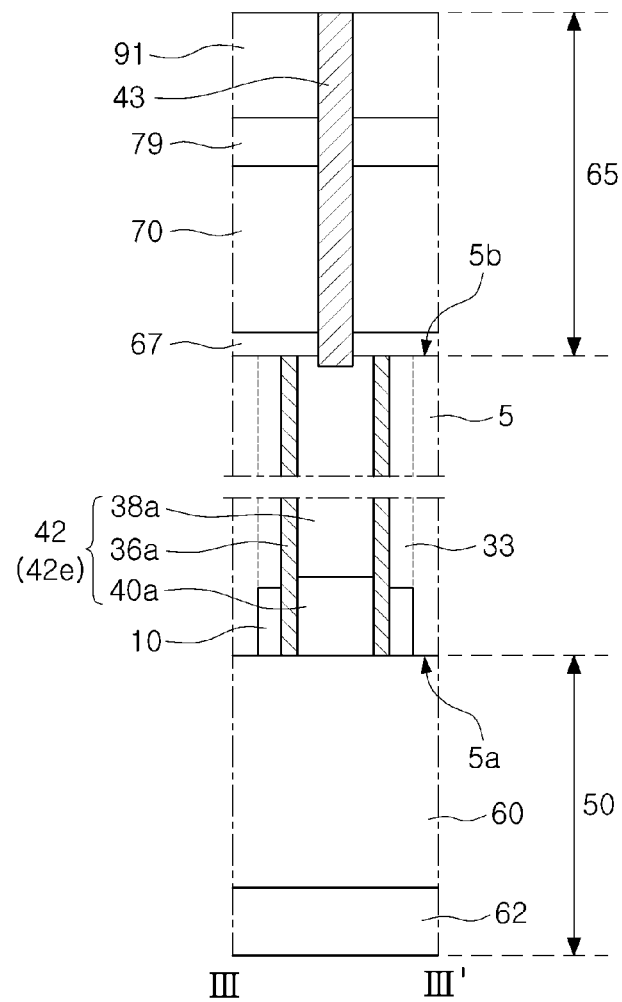
FIG. 16 is a cross-sectional view illustrating a modified example of an image sensing device, according to an example embodiment.

The separation structure 42 mentioned above may be disposed within the pixel array region SA, and may be covered by the front-side structure 50 and the back-side structure 65. The first conductive pattern 38$a$ disposed within the separation structure 42 may be electrically floated or isolated. For example, a lateral surface of the first conductive pattern 38$a$ may be surrounded by the first insulating spacer 36$a$. A surface of the first conductive pattern 38$a$, contacting the back-side structure 65, may be covered by the anti-reflective layer 67, having insulating properties. A surface of the first conductive pattern 38$a$, contacting the front-side structure 50, may be covered by the front insulating material 60. Thus, the first conductive pattern 38$a$ may be entirely covered by an insulating material. However, example embodiments of the present disclosure are not limited thereto. For example, a voltage may be applied to the first conductive pattern 38$a$, in order to prevent an interference or influence between the photoelectric devices SPD within pixels, for example, the pixel regions PX of FIG. 2, adjacent to each other. The example, as described above, will be described with reference to FIGS. 15 and 16. FIG. 15 is a plan view illustrating a modified example of an image sensing device, according to an example embodiment. FIG. 16 is a cross-sectional view illustrating a modified example of an image sensing device, according to an example embodiment. The modified examples will be described with reference to the above-described constituent elements.

Figure 17:
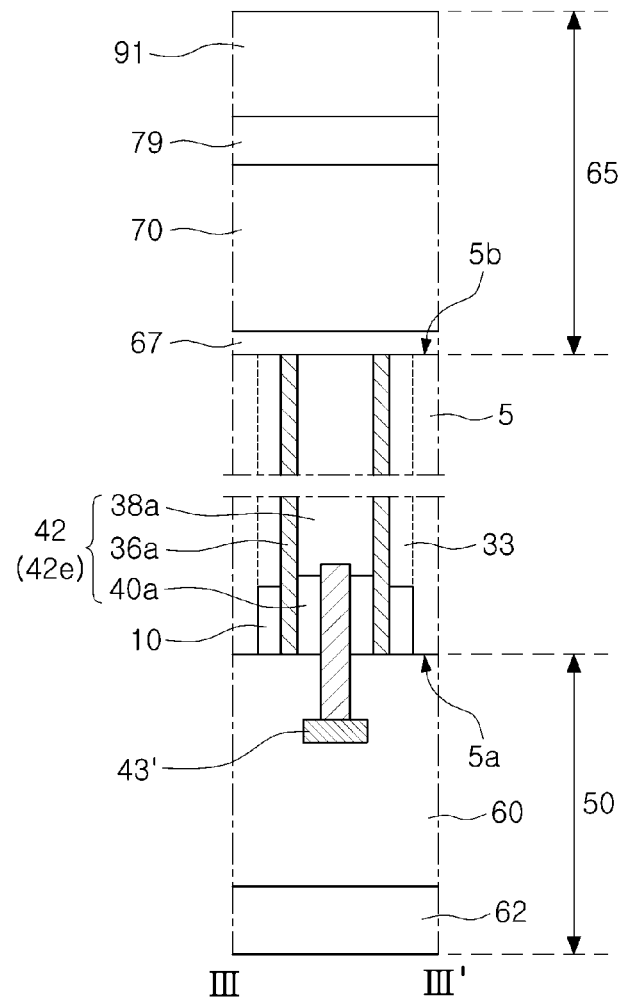
FIG. 17 is a cross-sectional view illustrating a modified example of an image sensing device, according to an example embodiment.

Referring to FIGS. 3A, 3B, 4, 5, 15, and 16, the separation structure 42 may include a pad region 42$e$ extending from the pixel array region SA to the peripheral region PA of FIG. 2. The back-side structure 65 includes a conductive plug 43 electrically connected to a portion of the first conductive pattern 38$a$ in the pad region 42$e$ of the separation structure 42. However, example embodiments of the present disclosure are not limited thereto. As illustrated in FIG. 17, the back-side structure 65 may not include a conductive plug electrically connected to the first conductive pattern 38$a$, and the front-side structure 50 includes a conductive plug 43' electrically connected to the first conductive pattern 38$a$. As described above with reference to FIGS. 15 through 17, the first conductive pattern 38$a$ of the separation structure 42 may be insulated from one of the front-side structure 50 and the back-side structure 65.

As described above, the first conductive pattern 38$a$ of the separation structure 42 may be insulated from the front-side structure 50, or the back-side structure 65, or both. For example, the first conductive pattern 38$a$ may be insulated from at least one of the front-side structure 50 and the back-side structure 65.

An example progression of a method of forming the image sensing device, according to an example embodiment, will be described with reference to FIGS. 18, 19, 20A, 20B, 21, 22, 23, and 24.

FIGS. 18, 19, 20A, 20B, 21, 22, 23, and 24 are cross-sectional views illustrating regions taken along lines I-I' and II-II' of FIGS. 3A and 3B.

Figure 18:
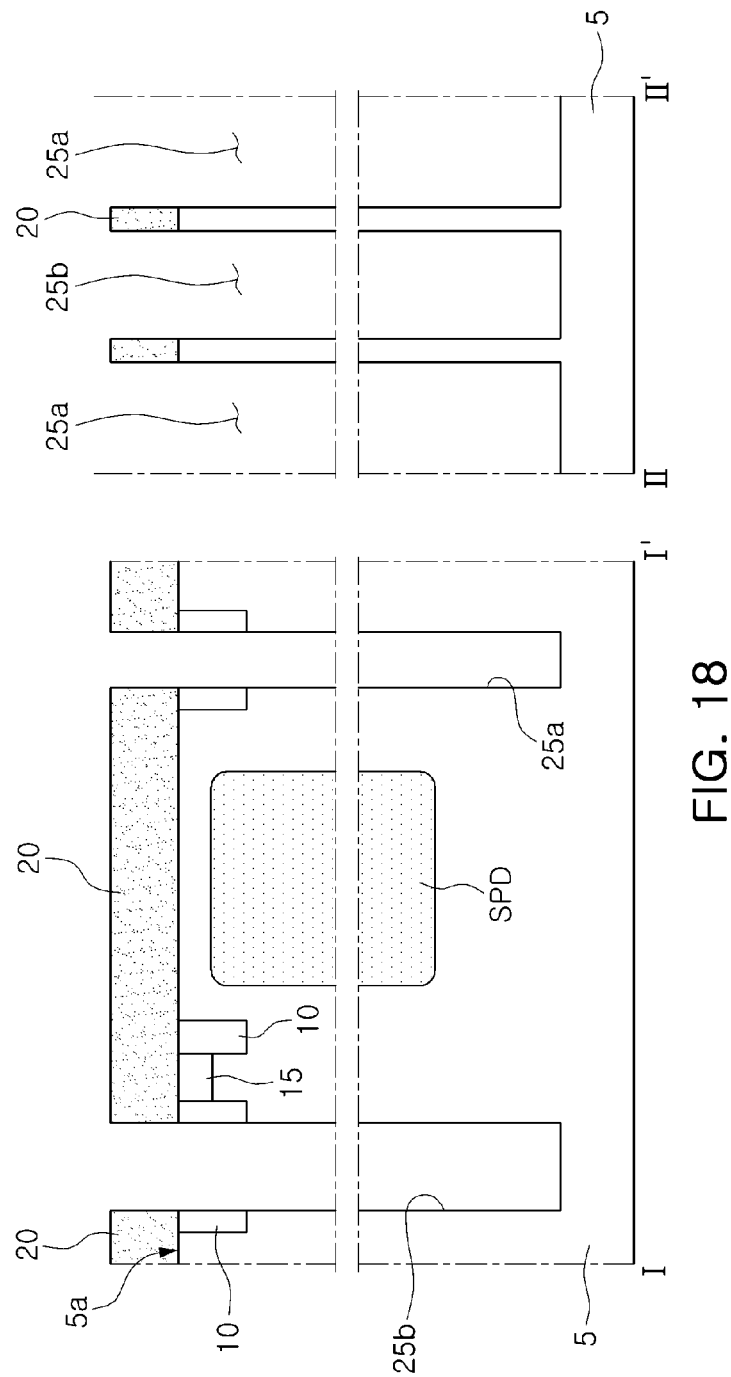
FIGS. 18, 19, 20A, 20B, 21, 22, 23, and 24 are cross-sectional views illustrating an example progression of a method of forming the image sensing device, according to an example embodiment.

Referring to FIGS. 3A, 3B, and 18, a semiconductor substrate 5 may be provided. The semiconductor substrate 5 may be formed of a semiconductor material, such as silicon.

In an example embodiment, a photoelectric device SPD may be formed within the semiconductor substrate 5. The photoelectric device SPD may be provided as multiple photoelectric devices SPD spaced apart from each other. The photoelectric device SPD may be a photodiode that may be formed by an ion implantation process of injecting impurities into the semiconductor substrate 5 through a first surface 5$a$ of the semiconductor substrate 5. For example, the photoelectric device SPD may be a photodiode in which a region having p-type conductivity and a region having n-type conductivity may form a p-n junction, within the semiconductor substrate 5.

In an example embodiment, shallow trench isolation regions 10 may be formed on the first surface 5$a$ of the semiconductor substrate 5. The shallow trench isolation region 10 may be filled with an insulating material.

In an example embodiment, a storage node region 15 may be formed in a region of the semiconductor substrate 5 defined by the shallow trench isolation region 10. The storage node region 15 may be formed by an ion implantation process, and may have n-type conductivity.

A mask pattern 20 may be formed on the first surface 5$a$ of the semiconductor substrate 5.

By using the mask pattern 20 as an etching mask, the semiconductor substrate 5 may be etched to form an opening 25$a$ (such as a trench) and holes 25$b$.

The opening 25$a$ (such as a trench) and the holes 25$b$ may extend into the semiconductor substrate 5, while passing through the shallow trench isolation region 10.

Referring to FIGS. 3A, 3BA, and 19, an oxide layer 30 may be formed by thermally oxidizing portions of the first surface 5$a$ of the semiconductor substrate 5 exposed by the opening 25$a$ (such as a trench) and the holes 25$b$. Thus, damage to the first surface 5$a$ of the semiconductor substrate 5, which may occur in forming the opening 25$a$ (such as a trench) and the holes 25$b$, may be prevented.

By a plasma doping process, an impurity region 33 may be formed within each of the portions of the semiconductor substrate 5 exposed by the opening 25$a$ (such as a trench) and the holes 25$b$.

The impurity region 33 may be formed by spreading impurities, for example, B (boron), from side walls and bottoms of the opening 25$a$ (such as a trench) and the holes 25$b$ into the semiconductor substrate 5.

Figure 19:
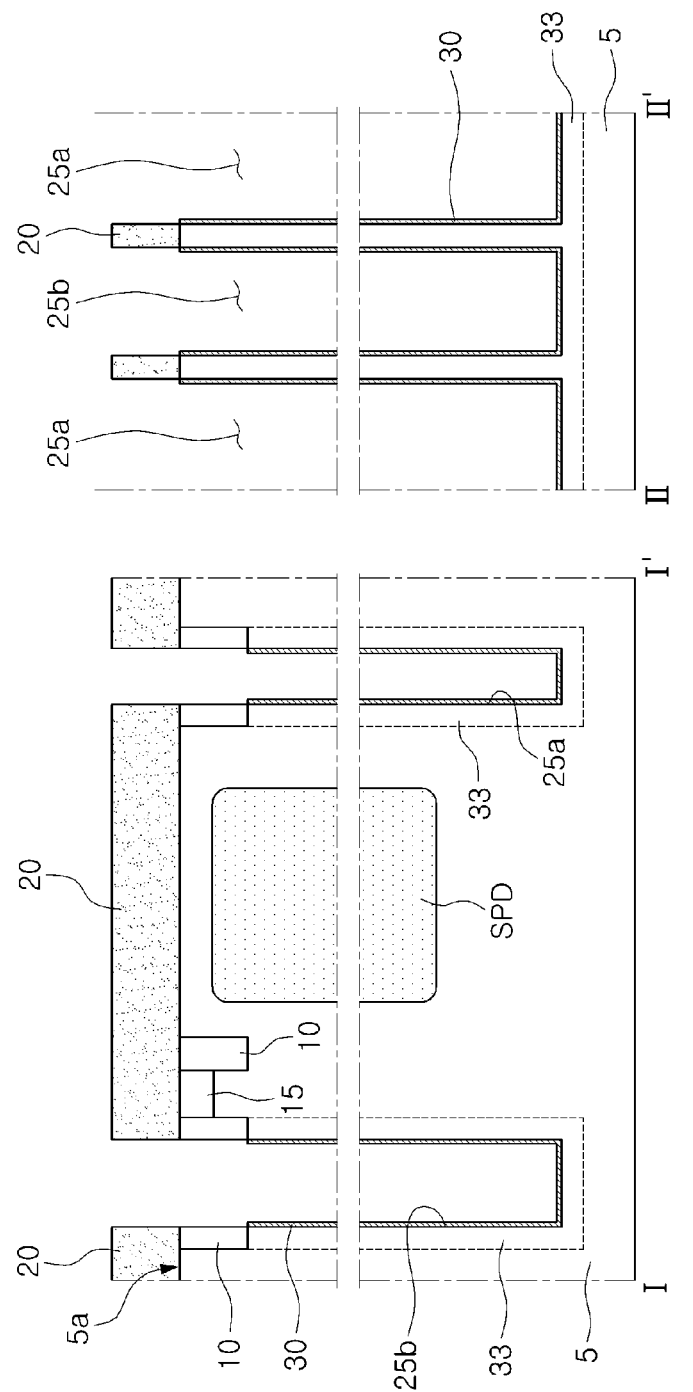
Figure 20A:
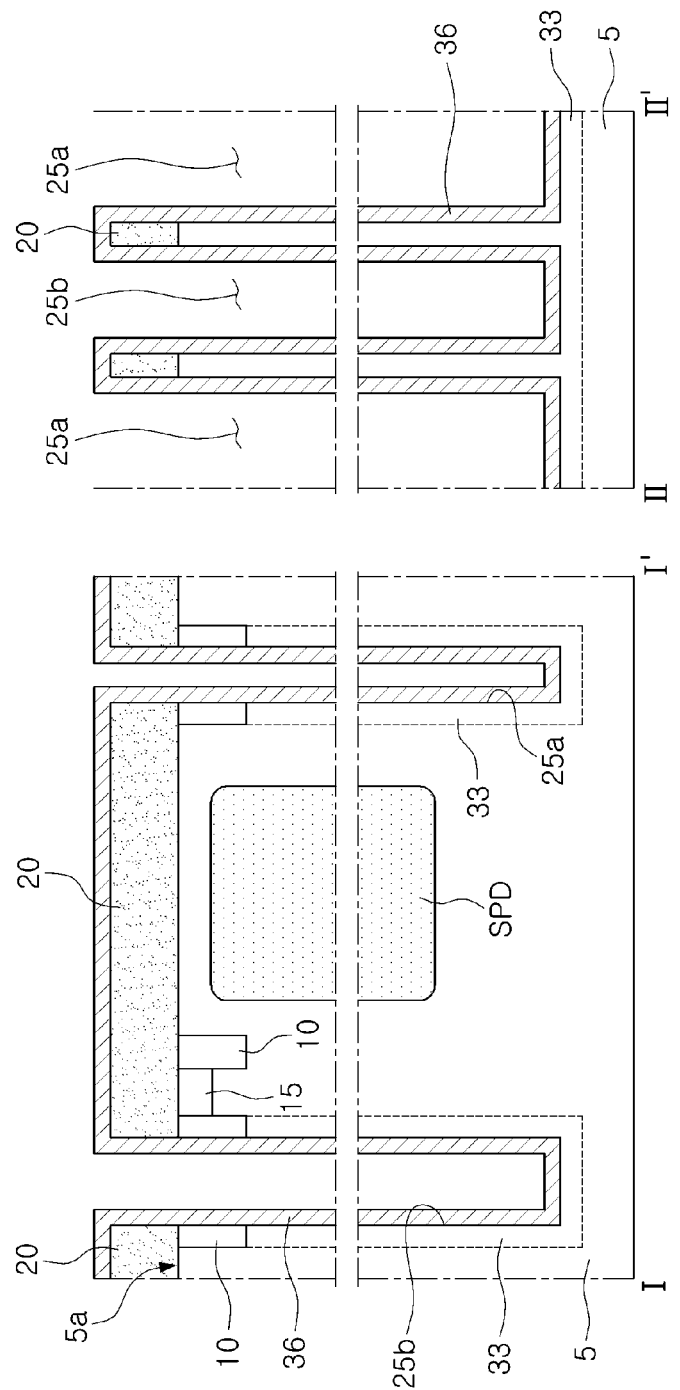

Referring to FIGS. 3A, 3B, and 20A, in an example embodiment, a spacer layer 36 may be formed to cover the mask pattern 20, while covering the side walls and bottoms of the opening 25$a$ (such as a trench) and the holes 25$b$, after the oxide layer 30 of FIG. 19 is removed.

In a modified example, a spacer layer 36 may be formed to cover the mask pattern 20, while covering the side walls and bottoms of the opening 25$a$ (such as a trench) and the holes 25$b$, without removing the oxide layer 30 of FIG. 19.

The spacer layer 36 may be formed of an insulating material including a silicon oxide. Alternatively, the spacer layer 36 may also be formed of an insulating material including a silicon oxide and a silicon nitride.

Figure 20B:
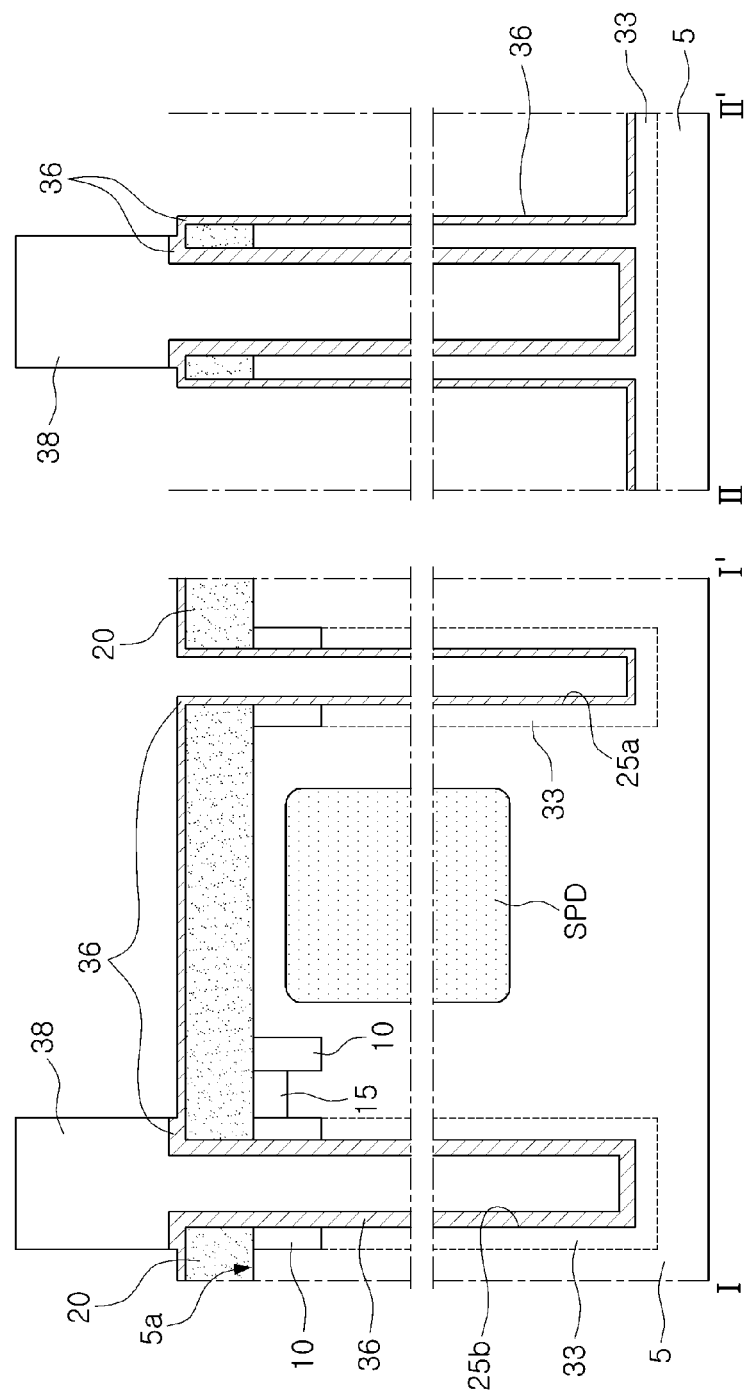

In an example embodiment, the spacer layer 36 may be formed on the side walls of the opening 25$a$ (such as a trench) and the holes 25$b$ to have a substantially uniform thickness. However, example embodiments of the present disclosure are not limited thereto. For example, portions of the spacer layer 36, formed on the side walls of the opening 25$a$ (such as a trench), may be thinner than those of the spacer layer 36 formed on the side walls of the holes 25$b$. For example, as illustrated in FIG. 20B, a portion of the spacer layer 36 may be etched by forming a photoresist pattern 38 that covers the holes 25*b* without covering the opening 25*a* (such as a trench), and then performing an isotropic etching process, using the photoresist pattern 38 as an etching mask. Subsequently, the photoresist pattern 38 may be removed.

Hereinafter, a semiconductor fabrication process will be described using a substrate having the spacer layer 36 with a substantially uniform thickness, described above with reference to FIG. 20A. However, the semiconductor fabrication process to be described later may be used for a substrate formed on the side walls of the opening 25*a* (such as a trench) and the holes 25*b* to have different thicknesses, described above with reference to FIG. 20B, in the same manner as the semiconductor fabrication process used for the substrate having the spacer layer 36 with a substantially uniform thickness.

Figure 21:
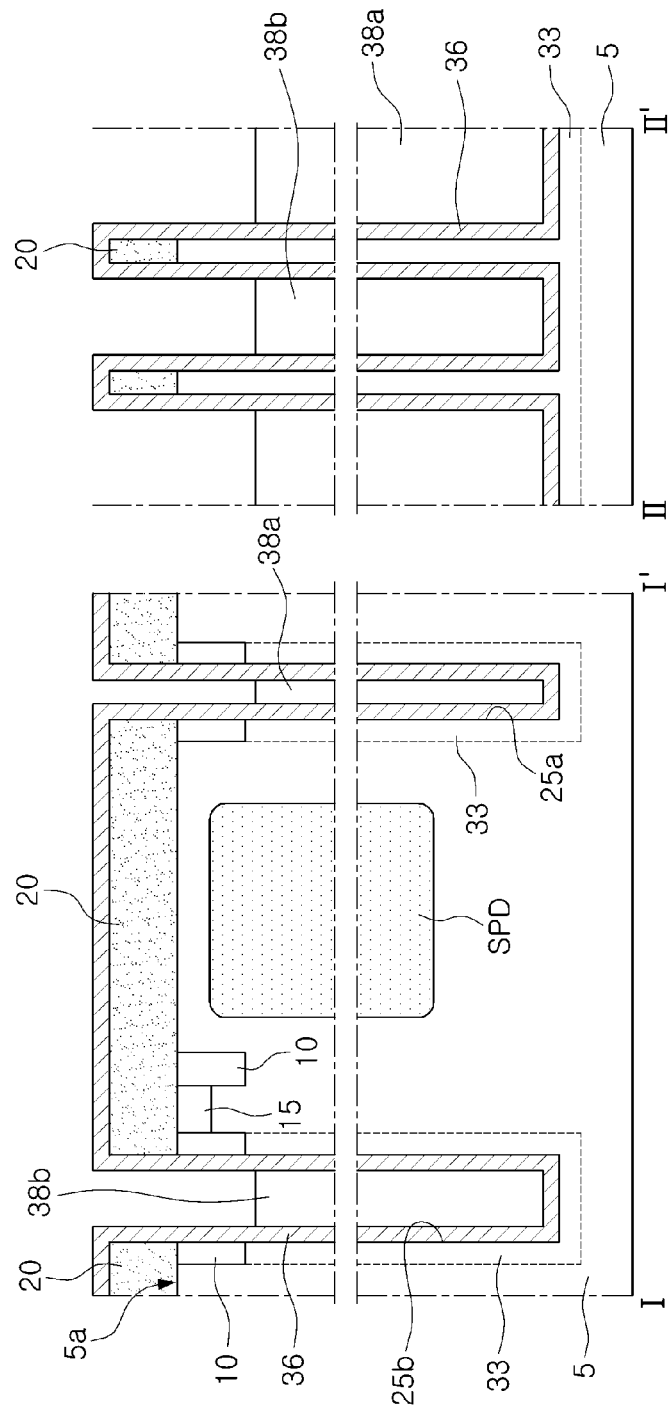

Referring to FIGS. 3A, 3B, and 21, in an example embodiment, a first conductive pattern 38*a* may be formed to fill a portion of the opening 25*a* (such as a trench), and a second conductive pattern 38*b* may be formed to fill each of portions of the holes 25*b*, by forming a conductive layer that fills the opening 25*a* (such as a trench) and the holes 25*b* and covers the spacer layer 36 and etching portions of the conductive layer.

The first conductive pattern 38*a* and second conductive pattern 38*b* may be formed of the same material. For example, the first conductive pattern 38*a* and second conductive pattern 38*b* may be formed of the same doped polycrystalline silicon material having the same conductivity type. For example, the first conductive pattern 38*a* and second conductive pattern 38*b* may be formed of n- or p-type doped polycrystalline silicon materials.

Figure 22:
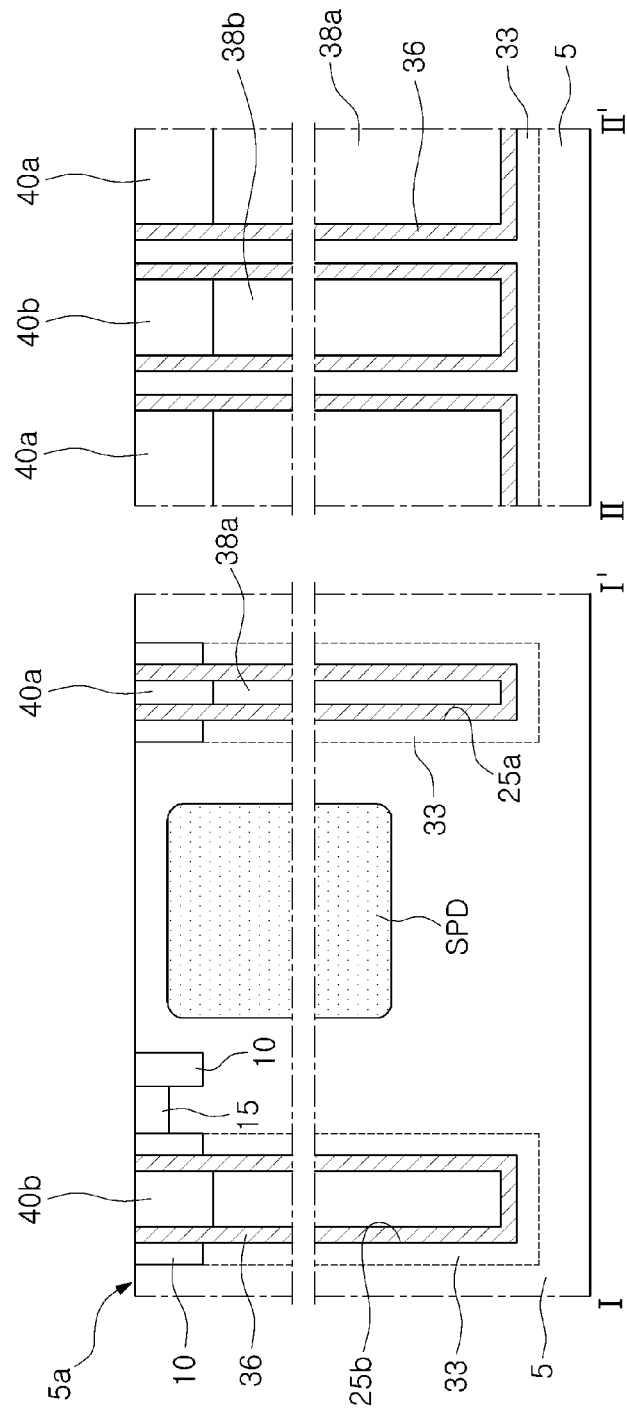

Referring to FIGS. 3A, 3B, and 22, the first surface 5*a* of the semiconductor substrate 5 may be exposed by forming an insulating material on the semiconductor substrate 5 having the first conductive pattern 38*a* and second conductive pattern 38*b*, flattening the insulating material, and removing the mask pattern 20 of FIG. 21. Thus, the flattened insulating material may be formed as a first insulating capping pattern 40*a* disposed on the first conductive pattern 38*a* to fill the remaining portion of the opening 25*a* (such as a trench), and as a second insulating capping pattern 40*b* disposed on the second conductive pattern 38*b* to fill the remaining portions of the holes 25*b*. The first insulating capping pattern 40*a* and second insulating capping pattern 40*b* may be formed of an insulating material, such as a silicon oxide and/or a silicon nitride.

The portion of the spacer layer 36 of FIG. 21, remaining in the opening 25*a* (such as a trench), may be referred to as the first insulating spacer 36*a*, and the portions of the spacer layer 36, remaining in the holes 25*b* may be referred to as the second insulating spacer 36*b*.

The first insulating spacer 36*a*, the first conductive pattern 38*a*, and the first insulating capping pattern 40*a* formed within the opening 25*a* (such as a trench) may constitute a separation structure 42.

The second insulating spacer 36*b*, the second conductive pattern 38*b*, and the second insulating capping pattern 40*b* formed within each of the holes 25*b* may constitute an electrode structure 46.

Figure 23:
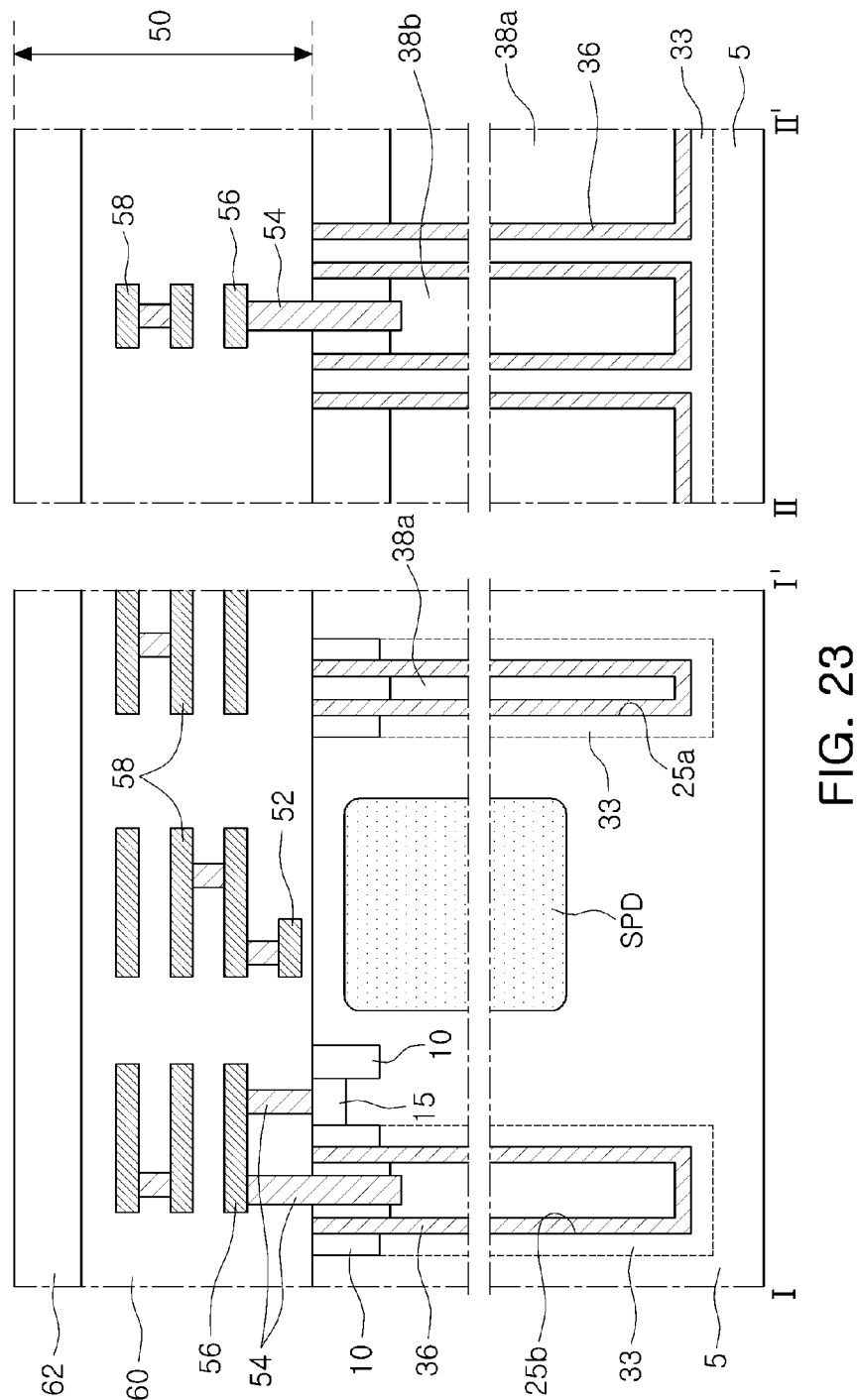

Referring to FIGS. 3A, 3B, and 23, a front-side structure 50 may be formed on the first surface 5*a* of the semiconductor substrate 5. The front-side structure 50 may be formed by a semiconductor fabrication process, such as a photolithography process or a deposition process. The front-side structure 50 includes the gate wiring 52, the connection wiring 56, the front-side contact plugs 54, the front wirings 58, the front insulating material 60, and the support layer 62.

Figure 24:
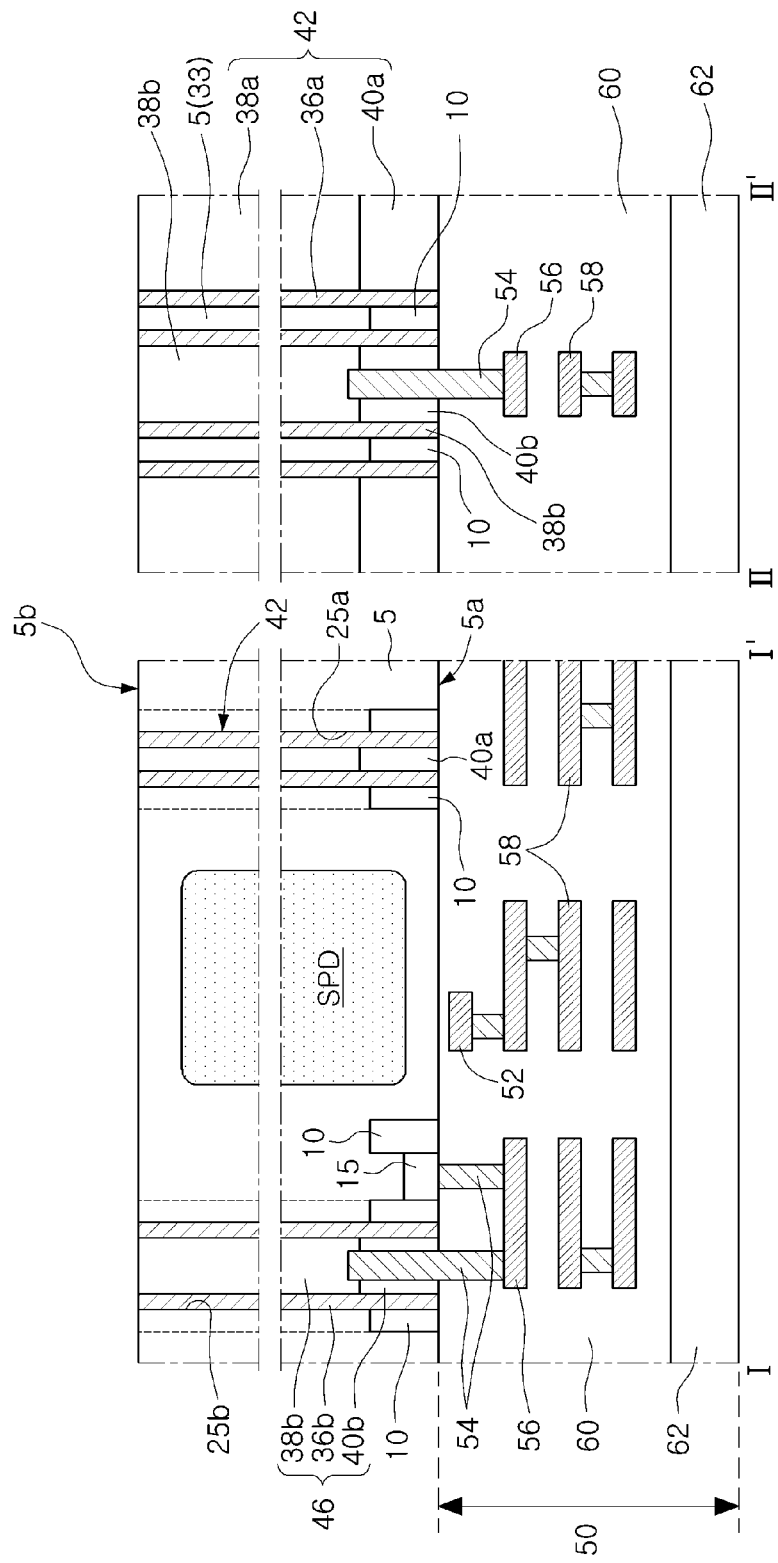

Referring to FIGS. 3A, 3B, and 24, the first conductive pattern 38*a* of the separation structure 42 and the second conductive pattern 38*b* of the electrode structure 46 may be exposed by a grinding process or a back-grinding process of reducing the thickness of the semiconductor substrate 5. The bottom of the opening 25*a* (such as a trench) may be removed, while the thickness of the semiconductor substrate 5 is reduced, and the opening 25*a* (such as a trench) may be formed as an opening passing through the semiconductor substrate 5. Thus, the term "opening 25*a*" may be replaced with the term "trench" for the purpose of description.

A surface of the semiconductor substrate 5 to which the first conductive pattern 38*a* and second conductive pattern 38*b* may be exposed while the semiconductor substrate 5 is reduced in thickness, may be defined as a second surface 5*b*. The second surface 5*b* of the semiconductor substrate 5 may be opposite to the first surface 5*a*.

Referring to FIGS. 3A, 3B, and 4, a back-side structure 65 may be formed on the second surface 5*b* of the semiconductor substrate 5. The back-side structure 65 may be formed by a semiconductor fabrication process, such as a photolithography process or a deposition process. The back-side structure 65 includes the anti-reflective layer 67, the first insulating layer 70, the color filter 73, the second insulating layer 79, the first electrodes 82, the photoelectric layer 85, the second electrode 88, the insulating cover layer 91, and the microlenses 94, as described above with reference to FIGS. 3A, 3B, 4, and 5.

As described above, since the separation structure 42 and the electrode structures 46, which may be formed simultaneously, may be provided, the productivity of the image sensing device 1000 may be increased. Since the simultaneously formed separation structure 42 and electrode structures 46, as described above, may significantly reduce an interference or influence between the photoelectric devices SPD disposed within adjacent pixels by including the first conductive pattern 38*a* and second conductive pattern 38*b*, the performance of the image sensing device 1000 may be increased.

As set forth above, according to example embodiments of the present disclosure, an image sensing device includes a separation structure and electrode structures that may be formed simultaneously. By simultaneously forming the separation structure and the electrode structures, productivity of the image sensing device may be increased. Since the simultaneously formed separation structure and electrode structures as described above may significantly reduce an interference or influence between photoelectric devices disposed within adjacent pixels by including conductive materials, the performance of the image sensing device may be increased.

While exemplary embodiments have been shown and described above, it will be apparent to those skilled in the art that modifications and variations could be made without departing from the scope of the present disclosure, as defined by the appended claims.

What is claimed is:

1. An image sensing device, comprising:
   a semiconductor substrate;
   a photoelectric device disposed within the semiconductor substrate;
   a separation structure disposed within an opening passing through the semiconductor substrate; and
   an electrode structure disposed within a hole passing through the semiconductor substrate, wherein the separation structure comprises a first conductive pattern, and a first insulating spacer between the first conductive pattern and the semiconductor substrate, wherein the electrode structure comprises a second conductive pattern, and a second insulating spacer between the second conductive pattern and the semiconductor substrate, wherein the separation structure further comprises line portions extending in a first direction, and extension portions extending from the line portions in a second direction perpendicular to the first direction, wherein the line portions comprise a first line portion and a second line portion parallel and adjacent to each other, wherein the extension portions comprise a first extension portion extended from the first line portion and a second extension portion extended from the second line portion, wherein the first extension portion is spaced apart from the second line portion, wherein the second extension portion is spaced apart from the first line portion, and wherein at least a portion of the electrode structure is disposed between the first extension portion and the second extension portion in the second direction.

2. The image sensing device of claim 1,
wherein the first conductive pattern and the second conductive pattern have the same conductivity type, and are formed of doped polycrystalline silicon having the same impurity concentration.

3. The image sensing device of claim 1, further comprising:
an impurity region extending from side walls of the opening and the hole into the semiconductor substrate.

4. The image sensing device of claim 1, further comprising:
a front-side structure disposed on a first surface of the semiconductor substrate; and
a back-side structure disposed on a second surface of the semiconductor substrate, wherein the first surface and second surface oppose each other; and
wherein a side of the photoelectric device is surrounded by the separation structure and the electrode structure.

5. The image sensing device of claim 4, wherein the back-side structure comprises:
a color filter disposed on the second surface of the semiconductor substrate, and overlapping the photoelectric device;
a first electrode disposed on the color filter;
a back-side contact plug electrically connecting the first electrode to the second conductive pattern;
a second electrode disposed on the first electrode;
an organic photoelectric layer disposed between the first electrode and the second electrode; and
a microlens disposed on the second electrode, and
wherein the front-side structure comprises a front-side contact plug electrically connected to the second conductive pattern.

6. The image sensing device of claim 1,
wherein a width of the electrode structure is less than a length of a respective one of the line portions in the first direction, and is greater than a width of the respective one of the line portions in the second direction, and
wherein the width of the electrode structure is a width in the first direction or the second direction.

7. The image sensing device of claim 1,
wherein a width of the electrode structure is greater than a width of a respective one of the extension portions in the first direction.

8. The image sensing device of claim 1,
wherein the extension portions comprise a first extension portion and a second extension portion extending by different lengths.

9. The image sensing device of claim 8,
wherein a length of the first extension portion in the second direction is greater than a length of the second extension portion in the second direction, and a width of the electrode structure in the second direction is less than the length of the first extension portion in the second direction.

10. The image sensing device of claim 1,
wherein a distance between the first extension portion and the electrode structure is less than a width of each of the line portions in the second direction.

11. The image sensing device of claim 1,
wherein the electrode structure is disposed closer to the second line portion than to the first line portion.

12. The image sensing device of claim 1,
wherein a width of the first insulating spacer is less than a width of the second insulating spacer.

13. An image sensing device, comprising:
a photoelectric device disposed within a semiconductor substrate; and
a separation structure and electrode structures disposed within the semiconductor substrate, and surrounding the photoelectric device,
wherein the separation structure comprises a first conductive pattern, and a first insulating spacer between the first conductive pattern and the semiconductor substrate,
wherein a respective one of the electrode structures comprises a second conductive pattern, and a second insulating spacer between the second conductive pattern and the semiconductor substrate,
wherein the first conductive pattern and the second conductive pattern include the same conductive material,
wherein the separation structure comprises line portions extending in a first direction, and extension portions extending from the line portions in a second direction, perpendicular to the first direction,
wherein the electrode structures are disposed between the extension portions in the second direction so that the electrode structures are each respectively disposed between two extension sections in the second direction, and
wherein a width in the first direction of each of the electrode structures is greater than a width in the first direction of each of the extension portions.

14. The image sensing device of claim 13, further comprising: an impurity region disposed within the semiconductor substrate,
wherein the impurity region has p-type conductivity, and is disposed within portions of the semiconductor substrate adjacent to a lateral surface of the separation structure and lateral surfaces of the electrode structures.

15. An image sensing device, comprising:
a semiconductor substrate having a first surface and a second surface opposing each other;
a photoelectric device disposed within the semiconductor substrate;
a front-side structure disposed on the first surface of the semiconductor substrate;

a back-side structure disposed on the second surface of the semiconductor substrate;

a separation structure and electrode structures disposed within the semiconductor substrate, and surrounding the photoelectric device; and a shallow trench isolation region disposed on the first surface of the semiconductor substrate, wherein the separation structure comprises a first conductive pattern, and a first insulating spacer between the first conductive pattern and the semiconductor substrate, wherein a respective one of the electrode structures comprises a second conductive pattern, and a second insulating spacer between the second conductive pattern and the semiconductor substrate, wherein the back-side structure comprises:
  a color filter overlapping the photoelectric device;
  a first electrode on the color filter;
  an organic photoelectric layer on the first electrode;
  a second electrode on the organic photoelectric layer; and
  a back-side contact plug electrically connecting the first electrode to the second conductive pattern, wherein the electrode structures are disposed within holes passing through the semiconductor substrate, wherein the separation structure is disposed within an opening passing through the semiconductor substrate, and wherein the holes, or the opening, or both, pass through the shallow trench isolation region.

16. The image sensing device of claim 15,
wherein the front-side structure comprises a front-side contact plug electrically connected to the second conductive pattern,
wherein the first conductive pattern is electrically insulated from at least one of the front-side structure and the back-side structure, and
wherein the first conductive pattern and the second conductive pattern include the same conductive material.

17. The image sensing device of claim 13, wherein a height between an upper surface of the first conductive pattern and a bottom surface of the first conductive pattern is substantially the same as a height between an upper surface of the second conductive pattern and a bottom surface of the second conductive pattern.

18. The image sensing device of claim 13,
wherein the separation structure comprises line portions extending in a first direction, and
wherein the line portions comprise a first line portion and a second line portion parallel and adjacent to each other, and, between the first line portion and the second line portion, the electrode structures comprise electrode structures disposed closer to the first line portion than to the second line portion, and electrode structures disposed closer to the second line portion than to the first line portion.

* * * * *